United States Patent
Yamazaki et al.

(10) Patent No.: US 9,589,988 B2
(45) Date of Patent: Mar. 7, 2017

(54) DISPLAY DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Setagaya (JP); Kengo Akimoto, Atsugi (JP); Atsushi Umezaki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/515,959

(22) Filed: Oct. 16, 2014

(65) Prior Publication Data

US 2015/0053976 A1    Feb. 26, 2015

Related U.S. Application Data

(63) Continuation of application No. 13/727,085, filed on Dec. 26, 2012, now Pat. No. 8,907,335, which is a (Continued)

(30) Foreign Application Priority Data

Oct. 3, 2008 (JP) .................................. 2008-259064
Jun. 25, 2009 (JP) .................................. 2009-150998

(51) Int. Cl.
*H01L 27/12* (2006.01)
*H01L 29/49* (2006.01)
(Continued)

(52) U.S. Cl.
CPC ......... *H01L 27/124* (2013.01); *G09G 3/3233* (2013.01); *H01L 21/02565* (2013.01);
(Continued)

(58) Field of Classification Search
CPC .......... H01L 27/11556; H01L 29/7883; H01L 21/28568; H01L 21/02164;
(Continued)

(56) References Cited

U.S. PATENT DOCUMENTS 5,338,959 A    8/1994    Kim et al.
5,731,856 A    3/1998    Kim et al.
(Continued)

FOREIGN PATENT DOCUMENTS

CN    001373384 A    10/2002
CN    001516279 A    7/2004
(Continued)

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
(Continued)

*Primary Examiner* — Robert Carpenter
(74) *Attorney, Agent, or Firm* — Robinson Intellectual Property Law Office; Eric J. Robinson

(57) ABSTRACT

With an increase in the definition of a display device, the number of pixels is increased, and thus the numbers of gate lines and signal lines are increased. The increase in the numbers of gate lines and signal lines makes it difficult to mount an IC chip having a driver circuit for driving the gate line and the signal line by bonding or the like, which causes an increase in manufacturing costs. A pixel portion and a driver circuit driving the pixel portion are provided over the same substrate. The pixel portion and at least a part of the driver circuit are formed using thin film transistors in each of which an oxide semiconductor is used. Both the pixel
(Continued)

portion and the driver circuit are provided over the same substrate, whereby manufacturing costs are reduced.

11 Claims, 32 Drawing Sheets

Related U.S. Application Data continuation of application No. 12/570,498, filed on Sep. 30, 2009, now Pat. No. 8,344,372.

(51) Int. Cl.
*H01L 29/51* (2006.01)
*H01L 21/02* (2006.01)
*H01L 29/12* (2006.01)
*G09G 3/32* (2016.01)

(52) U.S. Cl.
CPC .......... *H01L 27/12* (2013.01); *H01L 27/1214* (2013.01); *H01L 27/1225* (2013.01); *H01L 27/1259* (2013.01); *H01L 29/12* (2013.01); *H01L 29/4908* (2013.01); *H01L 29/513* (2013.01); *H01L 29/518* (2013.01); *G09G 2310/0286* (2013.01); *G09G 2310/0297* (2013.01)

(58) Field of Classification Search
CPC ......... H01L 21/02532; H01L 21/02592; H01L 21/02595; H01L 21/0217; H01L 27/11524; H01L 27/1157; H01L 27/11582; H01L 21/28282; H01L 21/28273; H01L 29/495; H01L 21/28556
See application file for complete search history.

(56) References Cited

U.S. PATENT DOCUMENTS

| | | | |
|---|---|---|---|
| 5,744,864 A | 4/1998 | Cillessen et al. |
| 5,847,410 A | 12/1998 | Nakajima |
| 6,294,274 B1 | 9/2001 | Kawazoe et al. |
| 6,355,940 B1 | 3/2002 | Koga et al. |
| 6,563,174 B2 | 5/2003 | Kawasaki et al. |
| 6,586,346 B1 | 7/2003 | Yamazaki et al. |
| 6,657,260 B2 | 12/2003 | Yamazaki et al. |
| 6,727,522 B1 | 4/2004 | Kawasaki et al. |
| 6,737,306 B2 | 5/2004 | Yamazaki et al. |
| 6,960,812 B2 | 11/2005 | Yamazaki et al. |
| 6,984,550 B2 | 1/2006 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,161,179 B2 | 1/2007 | Yamazaki et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,405,115 B2 | 7/2008 | Yamazaki et al. |
| 7,411,209 B2 | 8/2008 | Endo et al. |
| 7,427,776 B2 | 9/2008 | Hoffman et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,491,987 B2 | 2/2009 | Genrikh et al. |
| 7,501,293 B2 | 3/2009 | Ito et al. |
| 7,601,984 B2 | 10/2009 | Sano et al. |
| 7,601,994 B2 | 10/2009 | Fukuchi et al. |
| 7,674,650 B2 | 3/2010 | Akimoto et al. |
| 7,732,819 B2 | 6/2010 | Akimoto et al. |
| 7,745,824 B2 | 6/2010 | Yamazaki et al. |
| 7,791,082 B2 | 9/2010 | Iwasaki |
| 7,847,287 B2 | 12/2010 | Kim et al. |
| 7,883,912 B2 | 2/2011 | Fukuchi et al. |
| 8,003,449 B2 | 8/2011 | Akimoto et al. |
| 8,053,339 B2 | 11/2011 | Yamazaki et al. |
| 8,101,467 B2 | 1/2012 | Yamazaki et al. |
| 8,178,926 B2 | 5/2012 | Nakayama |
| 8,212,953 B2 | 7/2012 | Hosoya |
| 8,344,372 B2 * | 1/2013 | Yamazaki ............... H01L 27/12 257/43 |
| 8,399,313 B2 | 3/2013 | Akimoto et al. |
| 8,415,198 B2 | 4/2013 | Itagaki et al. |
| 8,629,442 B2 | 1/2014 | Yamazaki et al. |
| 8,735,889 B2 | 5/2014 | Yamazaki et al. |
| 8,976,308 B2 | 3/2015 | Hosoya |
| 8,987,068 B2 | 3/2015 | Yamazaki et al. |
| 9,130,049 B2 | 9/2015 | Sano et al. |
| 2001/0030323 A1 | 10/2001 | Ikeda |
| 2001/0046027 A1 | 11/2001 | Tai et al. |
| 2001/0052598 A1 | 12/2001 | Koga et al. |
| 2002/0043662 A1 | 4/2002 | Yamazaki et al. |
| 2002/0044111 A1 | 4/2002 | Yamazaki et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0051823 A1 | 3/2004 | Choi |
| 2004/0127038 A1 | 7/2004 | Carcia et al. |
| 2004/0184027 A1 | 9/2004 | Mizutani et al. |
| 2005/0017302 A1 | 1/2005 | Hoffman |
| 2005/0162579 A1 | 7/2005 | Jeong et al. |
| 2005/0199959 A1 | 9/2005 | Chiang et al. |
| 2005/0199960 A1 | 9/2005 | Hoffman et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292726 A1 | 12/2006 | Akimoto et al. |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0096816 A1 | 5/2007 | Paul et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252147 A1 | 11/2007 | Kim et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0042217 A1 | 2/2008 | Jeong et al. |

(56) References Cited

U.S. PATENT DOCUMENTS

| | | |
|---|---|---|
| 2008/0050595 A1 | 2/2008 | Nakagawara et al. |
| 2008/0050852 A1 | 2/2008 | Hwang et al. |
| 2008/0073653 A1 | 3/2008 | Iwasaki |
| 2008/0080221 A1 | 4/2008 | Koo et al. |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197350 A1 | 8/2008 | Park et al. |
| 2008/0203387 A1 | 8/2008 | Kang et al. |
| 2008/0224133 A1 | 9/2008 | Park et al. |
| 2008/0251789 A1* | 10/2008 | Chen .............. H01L 27/1214 257/59 |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0033818 A1 | 2/2009 | Nakajima et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0091678 A1 | 4/2009 | Jeong et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2009/0325341 A1 | 12/2009 | Itagaki et al. |
| 2010/0025678 A1 | 2/2010 | Yamazaki et al. |
| 2010/0065844 A1 | 3/2010 | Tokunaga |
| 2010/0084650 A1 | 4/2010 | Yamazaki et al. |
| 2010/0084651 A1 | 4/2010 | Yamazaki et al. |
| 2010/0092800 A1 | 4/2010 | Itagaki et al. |
| 2010/0102313 A1 | 4/2010 | Miyairi et al. |
| 2010/0102314 A1 | 4/2010 | Miyairi et al. |
| 2010/0109002 A1 | 5/2010 | Itagaki et al. |
| 2010/0117079 A1 | 5/2010 | Miyairi et al. |
| 2010/0301326 A1 | 12/2010 | Miyairi et al. |
| 2013/0126878 A1 | 5/2013 | Yamazaki et al. |
| 2014/0256116 A1 | 9/2014 | Yamazaki et al. |
| 2015/0179682 A1 | 6/2015 | Hosoya |
| 2015/0325707 A1 | 11/2015 | Sano et al. |

FOREIGN PATENT DOCUMENTS

| | | |
|---|---|---|
| CN | 001577851 A | 2/2005 |
| CN | 001875488 A | 12/2006 |
| CN | 001992294 A | 7/2007 |
| CN | 101036232 A | 9/2007 |
| CN | 101060139 A | 10/2007 |
| CN | 101174038 A | 5/2008 |
| CN | 101506986 A | 8/2009 |
| EP | 1017108 A | 7/2000 |
| EP | 1237195 A | 9/2002 |
| EP | 1737044 A | 12/2006 |
| EP | 1770788 A | 4/2007 |
| EP | 1892758 A | 2/2008 |
| EP | 1976018 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| EP | 2453480 A | 5/2012 |
| EP | 2453481 A | 5/2012 |
| EP | 2455975 A | 5/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-301565 A | 12/1988 |
| JP | 02-156676 A | 6/1990 |
| JP | 03-231472 A | 10/1991 |
| JP | 05-251705 A | 9/1993 |
| JP | 06-082823 A | 3/1994 |
| JP | 06-151307 A | 5/1994 |
| JP | 06-202156 A | 7/1994 |
| JP | 08-264794 A | 10/1996 |
| JP | 10-290012 A | 10/1998 |
| JP | 11-084418 A | 3/1999 |
| JP | 11-505377 | 5/1999 |
| JP | 11-163362 A | 6/1999 |
| JP | 2000-044236 A | 2/2000 |
| JP | 2000-150900 A | 5/2000 |
| JP | 2000-243974 A | 9/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-273228 A | 9/2003 |
| JP | 2003-280034 A | 10/2003 |
| JP | 2003-309266 A | 10/2003 |
| JP | 2004-103957 A | 4/2004 |
| JP | 2004-273614 A | 9/2004 |
| JP | 2004-273732 A | 9/2004 |
| JP | 2004-349583 A | 12/2004 |
| JP | 2006-165529 A | 6/2006 |
| JP | 2006-179878 A | 7/2006 |
| JP | 2007-096055 A | 4/2007 |
| JP | 2007-123861 A | 5/2007 |
| JP | 2007-150158 A | 6/2007 |
| JP | 2007-250983 A | 9/2007 |
| JP | 2007-529119 | 10/2007 |
| JP | 2007-299913 A | 11/2007 |
| JP | 2008-053356 A | 3/2008 |
| JP | 2008-053727 A | 3/2008 |
| JP | 2008-085048 A | 4/2008 |
| JP | 2009-533884 | 9/2009 |
| KR | 2005-0104800 A | 11/2005 |
| KR | 2007-0102939 A | 10/2007 |
| KR | 2008-0017965 A | 2/2008 |
| KR | 2009-0057257 A | 6/2009 |
| TW | 200822372 | 5/2008 |
| WO | WO-2004/114391 | 12/2004 |
| WO | WO-2005/041311 | 5/2005 |
| WO | WO-2005/047968 | 5/2005 |
| WO | WO-2005/093850 | 10/2005 |
| WO | WO-2006/041578 | 4/2006 |
| WO | WO-2006/051993 | 5/2006 |
| WO | WO-2007/119386 | 10/2007 |
| WO | WO-2007/120010 | 10/2007 |
| WO | WO-2008/023553 | 2/2008 |

OTHER PUBLICATIONS

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 482-492.

Takahashi.M et al., "Theoretical Analysis of Igzo Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

(56) References Cited

OTHER PUBLICATIONS

Nakamura.M et al., "The phase relations in the In2O3—GaZnO4—ZnO systems at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, In2)3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 187-187.

Li.C et al., "Modulated Structures of Homologous Compounds InMO3(ZnO)m (M=In,Ga; m=Integer) Described by Four-Dimesional Superspace Group", Journal of Solid State Chemistry, 1998, vol. 139, pp. 347-355.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Kurokawa,Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphus In-Ga-Zn-Oxide TFTs with Suppressed Variation for 4.0 inch QVGA AMOLED Display", AM-FPD '09 Digest of Technical Papers, Jul. 1, 2009, pp. 227-230, The Journal of Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-in. AMOLED Display with Driver Circuit Using Amorphous In-Ga-Zn-Oxide TFTs", IDW '09 : Proceeding of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AMOLED Driven by Peald Grown ZnO TFT", IMID '07 Digest, 2007, pp. 1249-1252.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Ohara.H et al., "21.3:4.0 in. QVGA AMOLED Display Using In-Ga-Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-686.

Kikuchi.H et al., "62.2:Invited Paper:Fast Electro-Optical Switching in Polymer-Stabilized Liquid Crystalline Blue Phase for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kimizuka.N. et al., "Spinel,YBFE2O4, and YB2FE3O7 Types of Structures for Compounds in the In2O3 and SC2O3—A2O3—BO Systems [A; Fe, Ga or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Reveiw Letters), May 4, 1981, vol. 46, No. 18, pp. 1216-1219.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structures", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B. (Physical Review. B), Jan. 15, 2000, vol. 61, No. 3, pp. 1811-1816.

(56) References Cited

OTHER PUBLICATIONS

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No.5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semicondutor Upone Exposure to Water", Appl. Phys. Lett. (Applied Physics Letters), 2008, vol.92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Diegest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Cho.Y et al., "Characteristics of a-Si:H Dual-Gate TFTs Using ITO Electrode for LCD Driver", AM-FPD '08 Digest of Technical Papers, Jul. 2, 2008, pp. 229-232.

Takahashi.K et al., "4p-N-10 Back-channel control in amorphous In—Ga—Zn—O TFTs", 69th Japan Society of Applied Physics, Sep. 1, 2008, No. 2, p. 851.

Chinese Office Action (Application No. 200910175792.5) Dated Mar. 19, 2013.

Korean Office Action (Application No. 2014-0132610) Dated Dec. 12, 2014.

Chinese Office Action (Application No. 201410147079.0) Dated Apr. 1, 2016.

Korean Office Action (Application No. 2009-0093997) Dated Oct. 4, 2016.

* cited by examiner

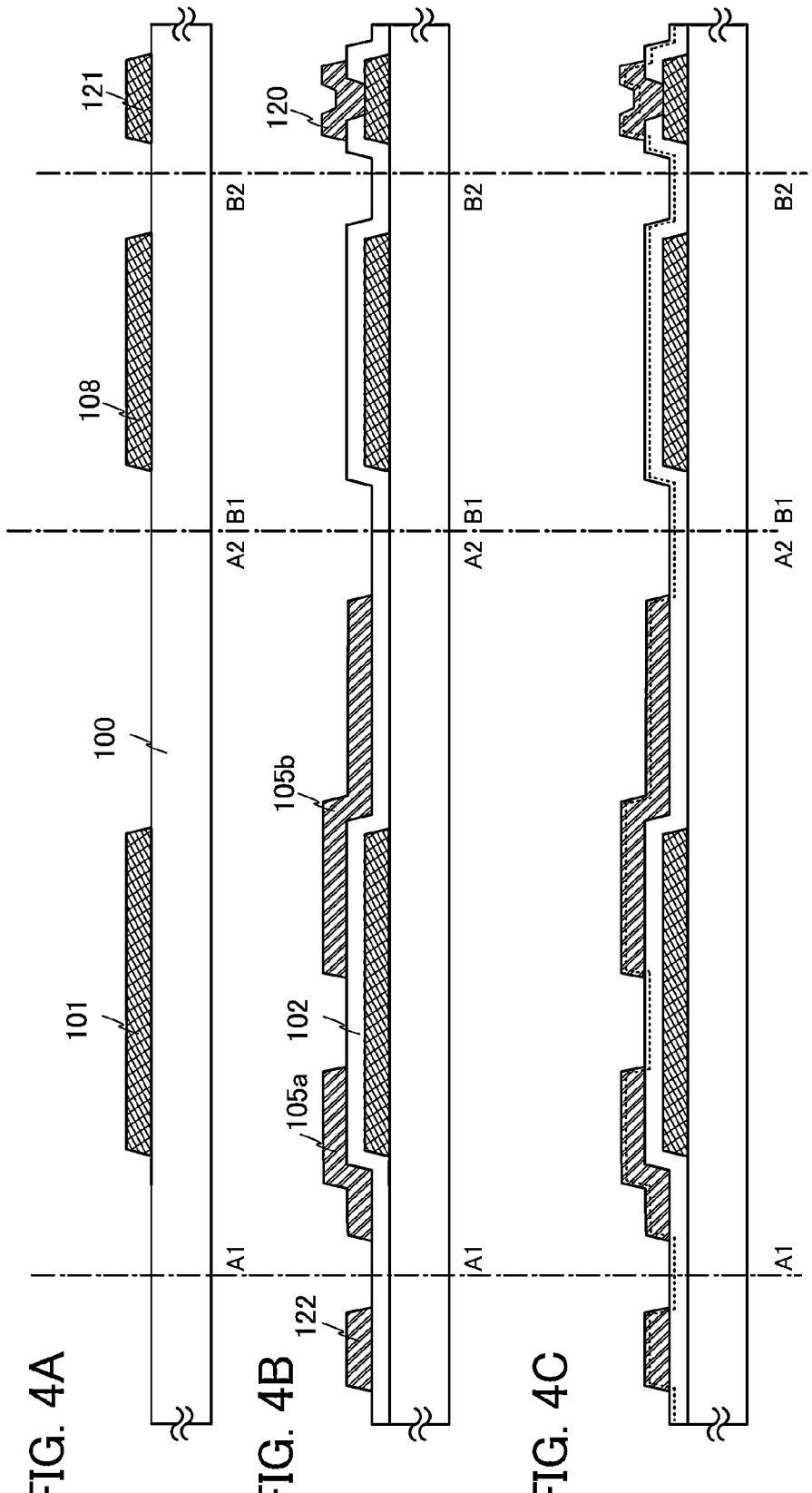

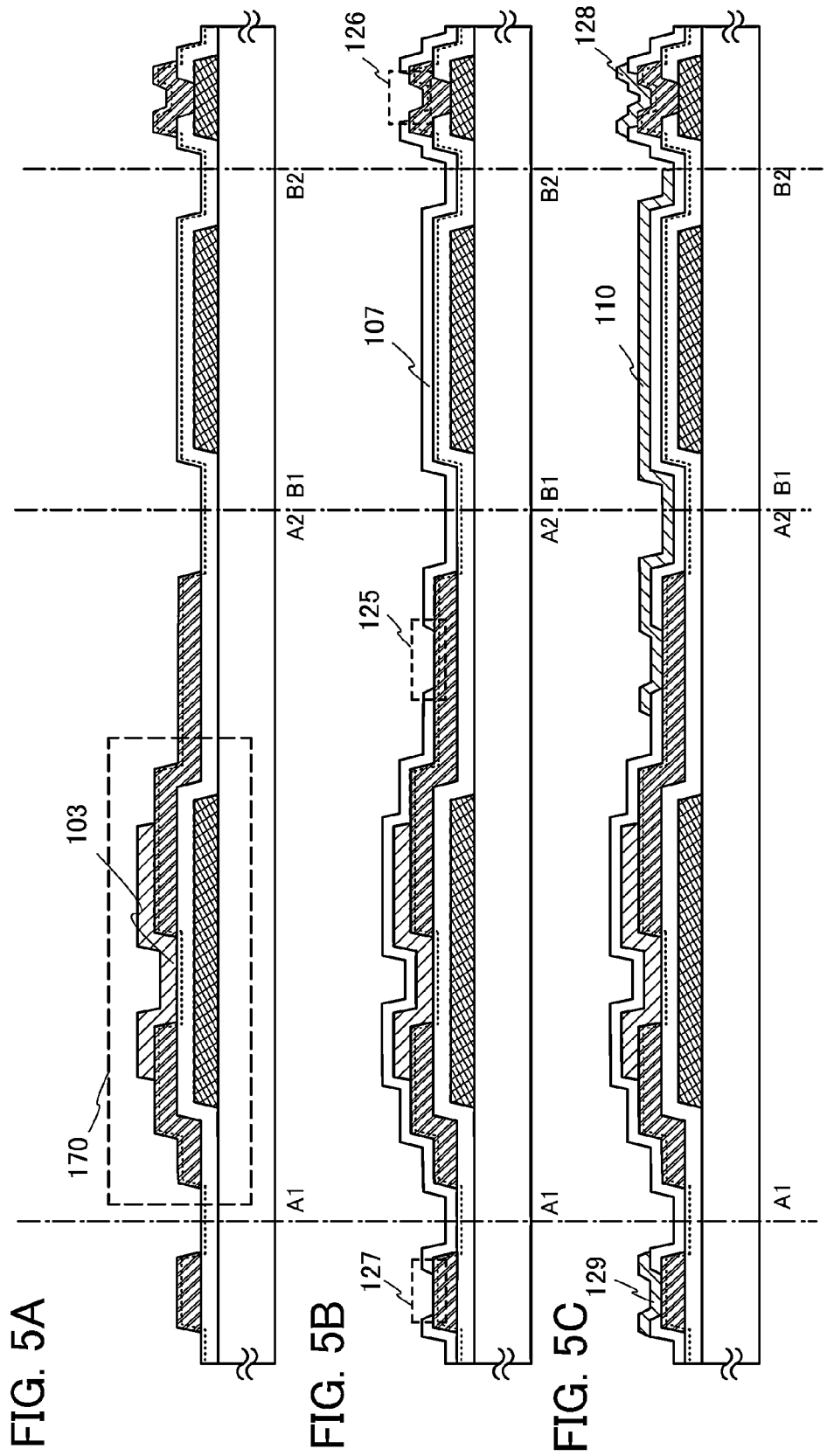

DISPLAY DEVICE AND METHOD FOR MANUFACTURING THE SAME

BACKGROUND OF THE INVENTION

1. Field of the Invention

The present invention relates to a display device in which an oxide semiconductor is used and a method for manufacturing the same.

2. Description of the Related Art

A thin film transistor formed over a flat plate such as a glass substrate is manufactured using amorphous silicon or polycrystalline silicon, as typically seen in a liquid crystal display device. A thin film transistor manufactured using amorphous silicon has low field effect mobility, but such a transistor can be formed over a glass substrate with a larger area. On the other hand, a thin film transistor manufactured using a crystalline silicon has high field effect mobility, but due to a crystallization step such as laser annealing, such a transistor is not always suitable for being formed over a larger glass substrate.

In view of the foregoing, attention has been drawn to a technique by which a thin film transistor is manufactured using an oxide semiconductor and such a transistor is applied to an electronic device or an optical device. For example, Patent Document 1 and Patent Document 2 disclose a technique by which a thin film transistor is manufactured using zinc oxide (ZnO) or an In—Ga—Zn—O based oxide semiconductor as an oxide semiconductor film and such a transistor is used as a switching element or the like of an image display device.

CITATION LIST

[Patent Document 1]
Japanese Published Patent Application No. 2007-123861
[Patent Document 2]
Japanese Published Patent Application No. 2007-096055

SUMMARY OF THE INVENTION

The field effect mobility of a thin film transistor using an oxide semiconductor for a channel formation region is higher than that of a thin film transistor using amorphous silicon. The oxide semiconductor film can be formed by sputtering or the like at a temperature of lower than or equal to 300° C. Its manufacturing process is easier than that of a thin film transistor using polycrystalline silicon.

Such an oxide semiconductor is expected to be used for forming a thin film transistor on a glass substrate, a plastic substrate, or the like, and to be applied to a liquid crystal display device, an electroluminescent display device, an electronic paper, or the like.

With an increase in the definition of a display device, the number of pixels is increased, and thus the numbers of gate lines and signal lines are increased. The increase in the numbers of gate lines and signal lines makes it difficult to mount an IC chip having a driver circuit for driving the gate lines and the signal lines by bonding or the like, which causes an increase in manufacturing costs.

Thus, it is an object of the present invention to reduce manufacturing costs by use of an oxide semiconductor for at least a part of a driver circuit for driving a pixel portion.

Further, it is another object of the present invention to reduce contact resistance or the like between wirings that connect elements in order to achieve high-speed driving of the driver circuit. For example, high contact resistance between a gate wiring and an upper wiring might distort an inputted signal.

Further, it is another object of the present invention to provide a structure of a display device, which is capable of reducing the number of contact holes and an area occupied by driver circuits.

In an embodiment of the present invention, a pixel portion and at least a part of a driver circuit for driving the pixel portion are formed using thin film transistors in each of which an oxide semiconductor is used over the same substrate. Both the pixel portion and the driver circuit are provided over the same substrate, whereby manufacturing costs are reduced.

As an oxide semiconductor used in this specification, a thin film of a material represented by $InMO_3(ZnO)_m$ (m>0) is formed, and a thin film transistor in which the thin film is used as a semiconductor layer is manufactured. Note that M denotes one or more of metal elements selected from gallium (Ga), iron (Fe), nickel (Ni), manganese (Mn), and cobalt (Co). In addition to a case where only Ga is contained as M, there is a case where Ga and the above metal elements other than Ga, for example, Ga and Ni or Ga and Fe are contained as M. Moreover, in the oxide semiconductor, in some cases, a transition metal element such as Fe or Ni or an oxide of the transition metal is contained as an impurity element in addition to a metal element contained as M. In this specification, this thin film is also referred to as an "In—Ga—Zn—O non-single-crystal film".

Table 1 shows a typical example of measurement by inductively coupled plasma mass spectrometry (ICP-MS). An oxide semiconductor film that is obtained in Condition 1 where a target (In:Ga:Zn=1:1:0.5) in which $In_2O_3$, $Ga_2O_3$, and NzO are contained at a ratio of 1:1:1 and a flow rate of an argon gas in a sputtering method is 40 sccm is $InGa_{0.95}Zn_{0.41}O_{3.33}$. In addition, an oxide semiconductor film obtained in Condition 2 where flow rates of an argon gas and oxygen in a sputtering method are 10 sccm and 5 sccm respectively is $InGa_{0.94}Zn_{0.40}O_{3.31}$.

TABLE 1

| Flow ratio | Composition (atomic %) | | | | |
|---|---|---|---|---|---|
| $Ar/O_2$ | In | Ga | Zn | O | Composition formula |
| 40/0 | 17.6 | 16.7 | 7.2 | 58.6 | $InGa_{0.95}Zn_{0.41}O_{3.33}$ |
| 10/5 | 17.7 | 16.7 | 7 | 58.6 | $InGa_{0.94}Zn_{0.40}O_{3.31}$ |

Further, Table 2 shows results of quantification performed using Rutherford backscattering spectrometry (RBS) instead of ICP-MS.

TABLE 2

| Flow ratio | Composition (atomic %) | | | | | |
|---|---|---|---|---|---|---|
| $Ar/O_2$ | In | Ga | Zn | O | Ar | Composition formula |
| 40/0 | 17 | 15.8 | 7.5 | 59.4 | 0.3 | $InGa_{0.93}Zn_{0.44}O_{3.49}$ |
| 10/5 | 16 | 14.7 | 7.2 | 61.7 | 0.4 | $InGa_{0.92}Zn_{0.45}O_{3.86}$ |

According to the results of the measurement of the sample in Condition 1 by RBS, an oxide semiconductor film is $InGa_{0.93}Zn_{0.44}O_{3.49}$. In addition, according to the results of the measurement of the sample in Condition 2 by RBS, an oxide semiconductor film is $InGa_{0.92}Zn_{0.45}O_{3.86}$.

An amorphous structure is observed in the In—Ga—Zn—O non-single-crystal film by X-ray diffraction (XRD). Note that heat treatment is performed on the In—Ga—Zn—O non-single-crystal film of the examined sample at 200° C. to 500° C., typically 300° C. to 400° C., for 10 minutes to 100 minutes after the film is formed by a sputtering method. In addition, a thin film transistor having electric characteristics such as an on/off ratio of greater than or equal to $10^9$ and a mobility of greater than or equal to 10 at a gate voltage of ±20 V can be manufactured.

It is useful to use the thin film transistor having such electric characteristics for a driver circuit. For example, a gate line driver circuit includes a shift register circuit for sequentially transferring a gate signal, a buffer circuit, and the like; and a source line driver circuit includes a shift register circuit for sequentially transferring a gate signal, an analog switch for switching on and off of transfer of an image signal to a pixel, and the like. A TFT in which an oxide semiconductor film having a higher mobility than a TFT in which amorphous silicon is used is capable of driving a shift register circuit at high speed.

Further, in a case where at least a part of a driver circuit for driving a pixel portion is formed using a thin film transistor in which an oxide semiconductor is used, the circuit is formed using n-channel TFTs, and a circuit illustrated in FIG. 1B is used as a basic unit. In addition, in the driver circuit, a gate electrode is directly connected to a source wiring or a drain wiring, whereby a favorable contact can be obtained, which leads to reduction in contact resistance. In a case where, in the driver circuit, the gate electrode is connected to a source wiring or a drain wiring through another conductive film, for example, a transparent conductive film, an increase in the number of contact holes, an increase in an area occupied by the contact holes due to the increase in the number of contact holes, or an increase in contact resistance and wiring resistance might be caused, and furthermore, an increase in complexity might be caused.

According to a structure of the present invention disclosed in this specification, a display device includes a pixel portion and a driver circuit, where the pixel portion includes a first thin film transistor having at least a first oxide semiconductor layer, the driver circuit includes a second thin film transistor having at least a second oxide semiconductor layer and a third thin film transistor having a third oxide semiconductor layer, a wiring which is directly connected to a gate electrode of the second thin film transistor provided below the second oxide semiconductor layer is a source wiring or a drain wiring of the third thin film transistor which is electrically connected to the third oxide semiconductor layer, and the third oxide semiconductor layer is on and in direct contact with the wiring.

An embodiment of the present invention achieves at least one of the above objects.

Further, in the above structure, the gate electrode of the second thin film transistor is electrically connected to the wiring through a contact hole formed in a gate insulating layer that covers the gate electrode. In addition, in the above structure, the pixel portion and the driver circuit are formed over the same substrate, whereby manufacturing costs are reduced.

Further, since the thin film transistor is easily broken by static electricity and the like, a protection circuit for protecting the driver circuits is preferably provided over the same substrate for a gate line or a source line. The protection circuit is preferably formed using a nonlinear element in which an oxide semiconductor is used.

Moreover, as a display device including a driver circuit, a light-emitting display device in which a light-emitting element is used and a display device in which an electrophoretic display element is used, which is also referred to as an "electronic paper", are given in addition to a liquid crystal display device.

In the light-emitting display device in which a light-emitting element is used, a plurality of thin film transistors are included in a pixel portion, and also in the pixel portion, there is a region where a gate electrode of one thin film transistor is directly connected to a source wiring or a drain wiring of another transistor. In addition, in the driver circuit of the light-emitting display device in which a light-emitting element is used, there is a region where a gate electrode of a thin film transistor is directly connected to a source wiring or a drain wiring of the thin film transistor.

Further, a manufacturing method is also an embodiment of the present invention. The manufacturing method includes the steps of: forming a first gate electrode and a second gate electrode over a substrate; forming a gate insulating layer that covers the first gate electrode and the second gate electrode; forming a contact hole that reaches the second gate electrode by selective etching of the gate insulating layer; forming a first wiring that is in direct contact with the second gate electrode through the contact hole and a second wiring that overlaps with both the first gate electrode and the second gate electrode through the first gate insulating layer; and forming a first oxide semiconductor layer that overlaps with the first gate electrode over the gate insulating layer and a second oxide semiconductor layer that overlaps with the second gate electrode over the gate insulating layer. The second oxide semiconductor layer is on and in direct contact with the first wiring and the second wiring. The above structure of the manufacturing method enables an inverter circuit which is a basic unit of a driver circuit to be manufactured.

Needless to say, the thin film transistor in the pixel portion as well as the driver circuit can also be formed over the same substrate.

Further, in the above manufacturing process, plasma treatment, specifically, reverse sputtering is preferably performed on a surface of the gate insulating layer to remove dust or the like on the surface before the first oxide semiconductor layer and the second oxide semiconductor layer are formed. In addition, plasma treatment, specifically, reverse sputtering is preferably performed on the surface of the gate insulating layer and a surface of the second gate electrode which is exposed at a bottom surface of the contact hole to remove dust or the like on the surfaces before the first wiring and the second wiring are formed.

Note that the ordinal numbers such as "first" and "second" in this specification are used for convenience and do not denote the order of steps and the stacking order of layers. In addition, the ordinal numbers in this specification do not denote particular names which specify the present invention.

A thin film transistor in which an oxide semiconductor is used in a gate line driver circuit or a source line driver circuit, whereby manufacturing costs are reduced. Moreover, a gate electrode of the thin film transistor used for the driver circuit is directly connected to a source wiring or a drain wiring, whereby a display device in which the number of contact holes can be reduced and an area occupied by the driver circuit is reduced can be provided.

BRIEF DESCRIPTION OF THE DRAWINGS

In the accompanying drawings:

FIGS. 4A to 4C are cross-sectional views illustrating a manufacturing process of a semiconductor device of an embodiment of the present invention;

FIGS. 5A to 5C are cross-sectional views illustrating a manufacturing process of a semiconductor device of an embodiment of the present invention;

DETAILED DESCRIPTION OF THE INVENTION

Embodiments of the present invention will be hereinafter described.

(Embodiment 1)

In Embodiment 1, an embodiment of the present invention will be described based on an example in which an inverter circuit is formed using two n-channel thin film transistors.

A driver circuit for driving a pixel portion is formed using an inverter circuit, a capacitor, a resistor, and the like. In a case where two n-channel TFTs are combined to form an inverter circuit, there are two types of combinations: a combination of an enhancement type transistor and a depression type transistor (hereinafter, a circuit formed by such a combination is referred to as an "EDMOS circuit") and a combination of enhancement type TFTs (hereinafter, a circuit formed by such a combination is referred to as an "EEMOS circuit"). Note that in a case where the threshold voltage of the n-channel TFT is positive, the n-channel TFT is defined as an enhancement type transistor, while in a case where the threshold voltage of the n-channel TFT is negative, the n-channel TFT is defined as a depression type transistor, and this specification follows the above definitions.

The pixel portion and the driver circuit are formed over the same substrate. In the pixel portion, on and off of voltage application to a pixel electrode are switched using enhancement type transistors arranged in a matrix. An oxide semiconductor is used for these enhancement type transistors arranged in the pixel portion. Since the enhancement type transistor has electric characteristics such as an on/off ratio of greater than or equal to $10^9$ at a gate voltage of ±20 V, leakage current is small and low power consumption drive can be realized.

Figure 1A:
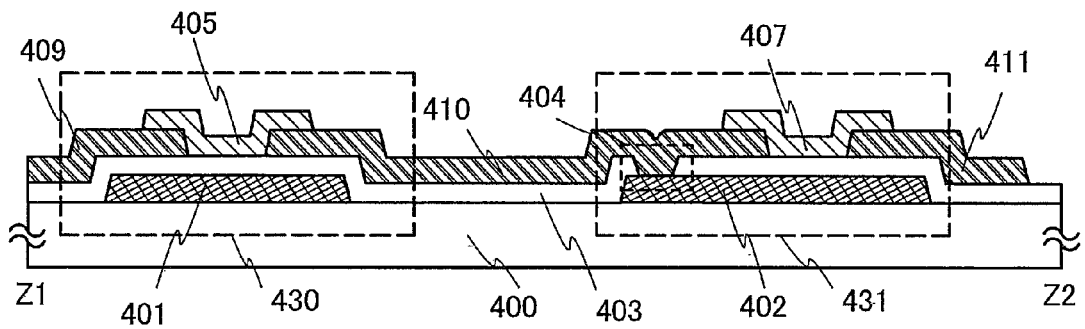
FIG. 1A is a cross-sectional view of a semiconductor device of an embodiment of the present invention.

FIG. 1A illustrates a cross-sectional structure of the inverter circuit of the driver circuit. In FIG. 1A, a first gate electrode 401 and a second gate electrode 402 are provided over a substrate 400. The first gate electrode 401 and the second gate electrode 402 can be formed to have a single-layer structure or a stacked-layer structure using a metal material such as molybdenum, titanium, chromium, tantalum, tungsten, aluminum, copper, neodymium, or scandium, or an alloy material containing any of these materials as its main component.

For example, as a two-layer structure of each of the first gate electrode 401 and the second gate electrode 402, the following two-layer structures are preferable: a two-layer structure of an aluminum layer and a molybdenum layer thereover, a two-layer structure of a copper layer and a molybdenum layer thereover, a two-layer structure of a copper layer and a titanium nitride layer or a tantalum nitride layer thereover, and a two-layer structure of a titanium nitride layer and a molybdenum layer. As a three-layer structure, the following structure is preferable: a stacked layer of a tungsten layer or a tungsten nitride layer, an alloy layer of aluminum and silicon or an alloy layer of aluminum and titanium, and a titanium nitride layer or a titanium layer.

Further, a first wiring 409, a second wiring 410, and a third wiring 411 are provided over a gate insulating layer 403 that covers the first gate electrode 401 and the second gate electrode 402. The second wiring 410 is directly connected to the second gate electrode 402 through a contact hole 404 formed in the gate insulating layer 403.

Further, a first oxide semiconductor layer 405 which is on the first wiring 409 and the second wiring 410 is provided at a position overlapping with the first gate electrode 401, and a second oxide semiconductor layer 407 which is on the second wiring 410 and the third wiring 411 is provided at a position overlapping with the second gate electrode 402. Note that plasma treatment is preferably performed on a surface of the gate insulating layer 403 before the first oxide semiconductor layer 405 and the second oxide semiconductor layer 407 are formed. For example, reverse sputtering in which plasma is generated by introduction of an argon gas is preferably performed to remove dust attached to the surface of the gate insulating layer 403 and a bottom surface of the contact hole 404 before the oxide semiconductor film is formed by a sputtering method. The reverse sputtering is a method in which voltage is applied to a substrate side, not to a target side, in an argon atmosphere and plasma is generated so that a substrate surface is modified. Note that nitrogen, helium, or the like may be used instead of an argon atmosphere. Alternatively, the reverse sputtering may be performed in an argon atmosphere to which oxygen, hydrogen, $N_2O$, or the like is added. Further alternatively, the reverse sputtering may be performed in an argon atmosphere to which $Cl_2$, $CF_4$, or the like is added.

A first thin film transistor 430 includes the first gate electrode 401 and the first oxide semiconductor layer 405 that overlaps with the first gate electrode 401 with the gate insulating layer 403 interposed therebetween, and the first wiring 409 is a power supply line at a ground potential (a ground power supply line). This ground potential power supply line may be a power supply line to which negative voltage VDL is applied (a negative power supply line).

Further, a second thin film transistor 431 includes the second gate electrode 402 and the second oxide semiconductor layer 407 that overlaps with the second gate electrode 402 with the gate insulating layer 403 interposed therebetween, and the third wiring 411 is a power supply line to which positive voltage VDD is applied (a positive power supply line).

As illustrated in FIG. 1A, the second wiring 410 which is electrically connected to both the first oxide semiconductor layer 405 and the second oxide semiconductor layer 407 is directly connected to the second gate electrode 402 of the second thin film transistor 431 through the contact hole 404 formed in the gate insulating layer 403. The second wiring 410 and the second gate electrode 402 are directly connected to each other, whereby favorable contact can be obtained, which leads to a reduction in contact resistance. In comparison with a case where the second gate electrode 402 and the second wiring 410 are connected to each other with another conductive film, for example, a transparent conductive film interposed therebetween, a reduction in the number of contact holes and a reduction in an area occupied by the driver circuit by the reduction in the number of contact holes can be achieved.

Figure 1B:
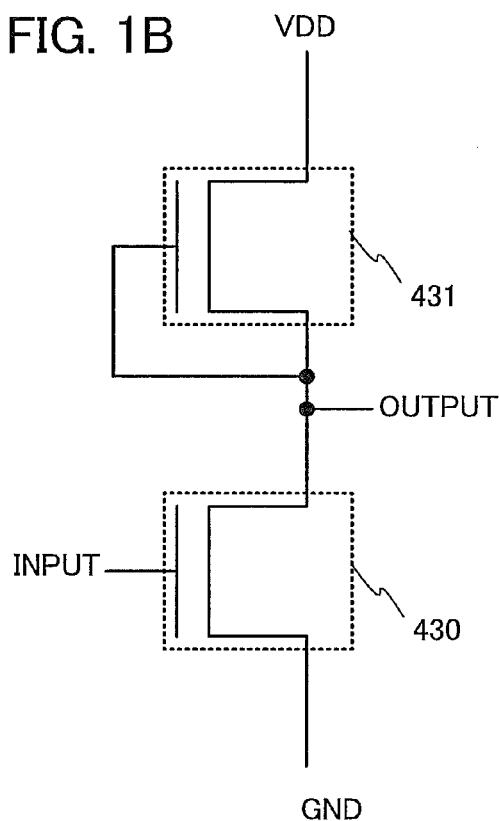
FIG. 1B is an equivalent circuit diagram.
Figure 1C:
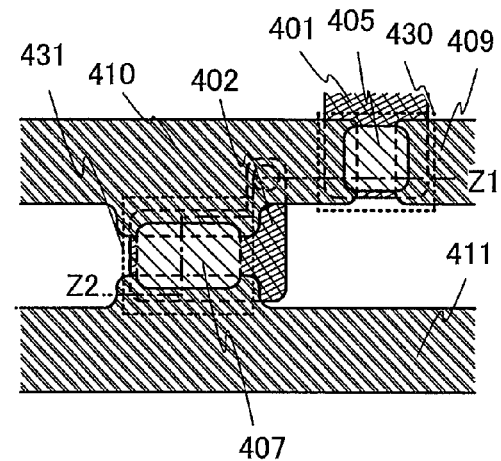
FIG. 1C is a top view of the same.

Further, FIG. 1C is a top view of the inverter circuit of the driver circuit. In FIG. 1C, a cross section taken along the chain line Z1-Z2 corresponds to FIG. 1A.

Further, FIG. 1B illustrates an equivalent circuit of the EDMOS circuit. The circuit connection illustrated in FIGS. 1A and 1C corresponds to that illustrated in FIG. 1B. An example in which the first thin film transistor 430 is an enhancement type n-channel transistor and the second thin film transistor 431 is a depression type n-channel transistor is illustrated.

In order to manufacture an enhancement type n-channel transistor and a depression type n-channel transistor over the same substrate, for example, he first oxide semiconductor layer 405 and the second semiconductor layer 407 are formed using different materials or under different conditions. Alternatively, an EDMOS circuit may be formed in such a manner that gate electrodes are provided over and under the oxide semiconductor layer to control the threshold value and voltage is applied to the gate electrodes so that one of the TFTs is normally on while the other TFT is normally off (Embodiment 2)

Figure 2A:
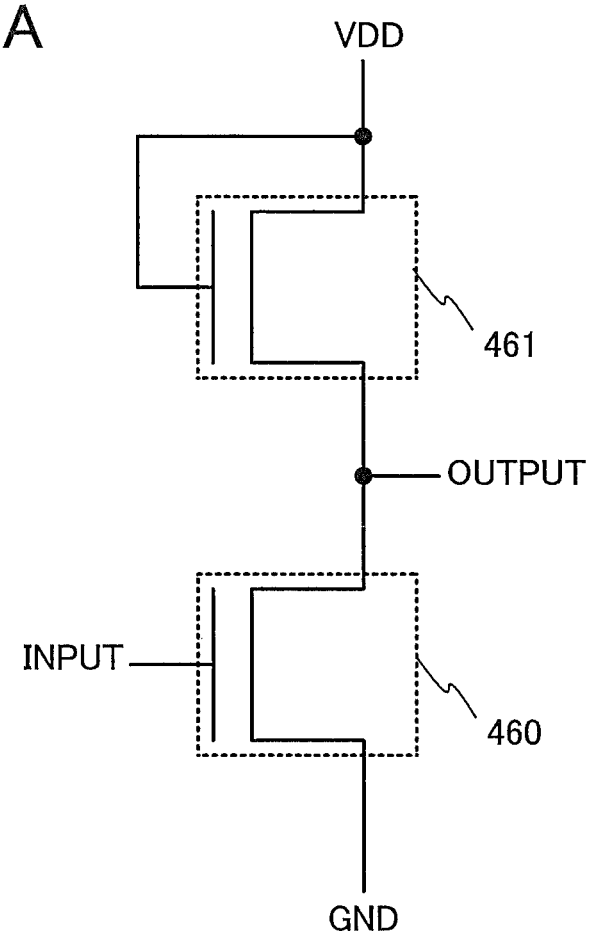
FIG. 2A is an equivalent circuit diagram and FIG. 2B is a top view thereof.

Although the example of the EDMOS circuit is described in Embodiment 1, an equivalent circuit of an EEMOS circuit is illustrated in FIG. 2A in Embodiment 2. In the equivalent circuit illustrated in FIG. 2A, a driver circuit can be formed using either a combination of enhancement type n-channel transistors or a combination of an enhancement type n-channel transistor as a first thin film transistor 460 and a depression type n-channel transistor as a second thin film transistor 461 that is the other one.

Figure 2B:
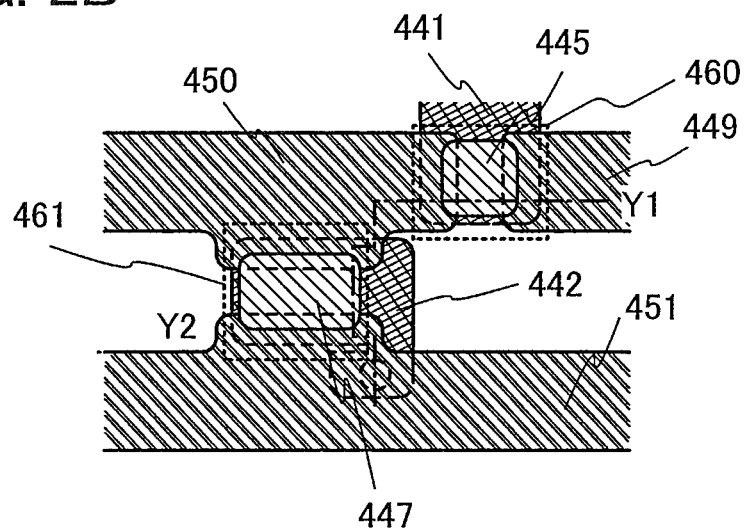

It can be said that using the circuit configuration illustrated in FIG. 2A in which enhancement type n-channel transistors of the same type are combined for the driver circuit is preferable, in which case a transistor used for a pixel portion is also formed of an enhancement type n-channel transistor which is the same type as that used for the driver circuit, which does not cause an increase in the number of manufacturing steps. In addition, FIG. 2B is a top view.

Figure 3A:
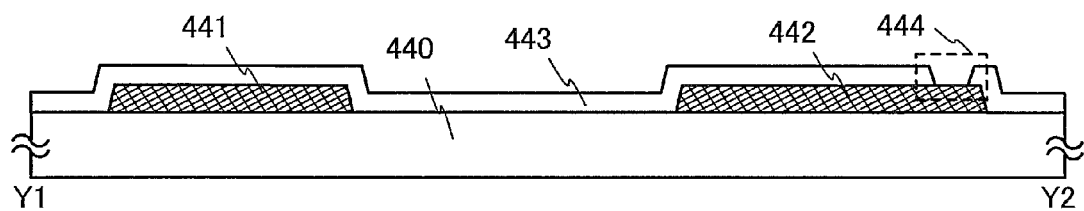
FIGS. 3A to 3C are cross-sectional views illustrating a manufacturing process of a semiconductor device of an embodiment of the present invention.
Figure 3B:
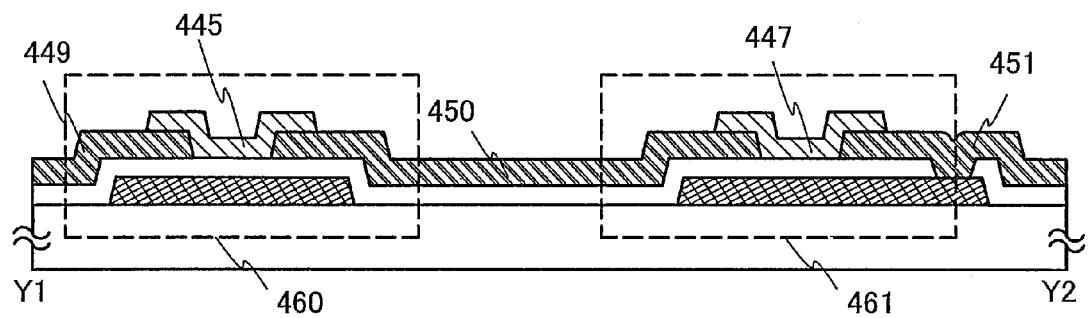
Figure 3C:
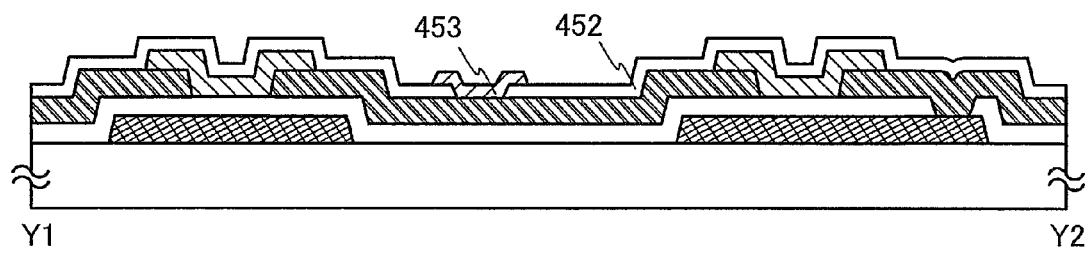

In addition, an example of a manufacturing process of an inverter circuit is illustrated in FIGS. 3A to 3C. Note that a cross section taken along the chain line Y1-Y2 corresponds to FIG. 3C.

A first conductive film is formed over a substrate 440 by a sputtering method and the first conductive film is selectively etched using a first photomask to form a first gate electrode 441 and a second gate electrode 442. Next, a gate insulating layer 443 for covering the first gate electrode 401 and the second gate electrode 442 is formed by a plasma CVD method or a sputtering method. The gate insulating layer 443 can be formed to have a single layer or a stacked layer of a silicon oxide layer, a silicon nitride layer, a silicon oxynitride layer, or a silicon nitride oxide layer by a CVD method, a sputtering method, or the like. Alternatively, the gate insulating layer 443 can be formed of a silicon oxide layer by a CVD method using an organosilane gas. As the organosilane gas, a silicon-containing compound such as tetraethoxysilane (TEOS: chemical formula, $Si(OC_2H_5)_4$), tetramethylsilane (TMS: chemical formula, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

Next, the gate insulating layer 443 is selectively etched using a second photomask to form a contact hole 444 that reaches the second gate electrode 442. A cross-sectional view of the steps so far corresponds to FIG. 3A.

Next, a second conductive film is formed over the gate insulating layer 443 by a sputtering method and the second conductive film is selectively etched using a third photomask to form a first wiring 449, a second wiring 450, and a third wiring 451. The third wiring 451 is directly in contact with the second gate electrode 442 through the contact hole 444. Note that reverse sputtering in which plasma is generated by introduction of an argon gas is preferably performed to remove dust attached to a surface of the gate insulating layer 443 and a bottom surface of the contact hole 444. The reverse sputtering is a method in which voltage is applied to a substrate side, not to a target side, in an argon atmosphere and plasma is generated so that a substrate surface is modified. Note that nitrogen, helium, or the like may be used instead of an argon atmosphere. Alternatively, the reverse sputtering may be performed in an argon atmosphere to which oxygen, hydrogen, $N_2O$, or the like is added. Further alternatively, the reverse sputtering may be performed in an argon atmosphere to which $Cl_2$, $CF_4$, or the like is added.

Next, an oxide semiconductor film is formed by a sputtering method.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal film.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering method, or a sputtering apparatus used for an ECR sputtering method in which plasma generated with use of microwaves is used without using glow discharge.

In the sputtering chamber of this embodiment, any of a variety of sputtering ways described above is used as appropriate.

Alternatively, as a deposition method, the following are also given: a reactive sputtering method in which a target substance and a sputtering gas component are chemically reacted with each other during deposition to form a thin compound film thereof and a bias sputtering method in which voltage is also applied to a substrate during deposition.

Note that reverse sputtering in which plasma is generated by introduction of an argon gas is preferably performed to remove dust attached to the surface of the gate insulating layer 443 and the surfaces of the first wiring 449, the second wiring 450, and the third wiring 451 before the oxide semiconductor film is formed by a sputtering method. The reverse sputtering is a method in which voltage is applied to a substrate side, not to a target side, in an argon atmosphere and plasma is generated so that a substrate surface is modified. Note that nitrogen, helium, or the like may be used instead of an argon atmosphere. Alternatively, the reverse sputtering may be performed in an argon atmosphere to which oxygen, hydrogen, $N_2O$, or the like is added. Further alternatively, the reverse sputtering may be performed in an argon atmosphere to which $Cl_2$, $CF_4$, or the like is added.

Next, the oxide semiconductor film is selectively etched using a fourth photomask. When this etching step is finished, a first thin film transistor 460 and a second thin film transistor 461 are completed. A cross-sectional view of the steps so far corresponds to FIG. 3B.

Next, heat treatment is performed at 200° C. to 600° C. in an air atmosphere or a nitrogen atmosphere. Note that the timing of this heat treatment is not particularly limited and the heat treatment may be performed anytime as long as it is performed after the formation of the oxide semiconductor film.

Next, a protective layer 452 is formed and the protective layer 452 is selectively etched using a fifth photomask to form a contact hole. After that, a third conductive film is formed. Finally, the third conductive film is selectively etched using a sixth photomask to form a connection wiring 453 that is electrically connected to the second wiring 450. A cross-sectional view of the steps so far corresponds to FIG. 3C.

In a light-emitting display device in which a light-emitting element is used, a pixel portion has a plurality of thin film transistors, and the pixel portion also has a contact hole for electrically connecting a gate electrode of one thin film transistor to a source wiring or a drain wiring of another transistor. This contact portion can be formed using the same mask as in the step of forming the contact hole in the gate insulating layer using the second photomask.

Further, as for a liquid crystal display device or an electronic paper, in a terminal portion for connection to an external terminal such as an FPC, the same mask can be used for a step of forming a contact hole that reaches a gate wiring and a step of forming a contact hole in a gate insulating layer using the second photomask.

(Embodiment 3)

In Embodiment 3, a manufacturing process of a terminal portion and a thin film transistor of a pixel portion which can be formed over the same substrate as the driver circuit described in Embodiment 1 or 2 and will be described using FIGS. 4A to 4C to FIG. 11.

In FIG. 4A, as a substrate 100 having a light-transmitting property, a glass substrate of barium borosilicate glass, aluminoborosilicate glass, or the like typified by #7059 glass, #1737 glass, or the like manufactured by Corning, Inc. can be used.

Figure 6:
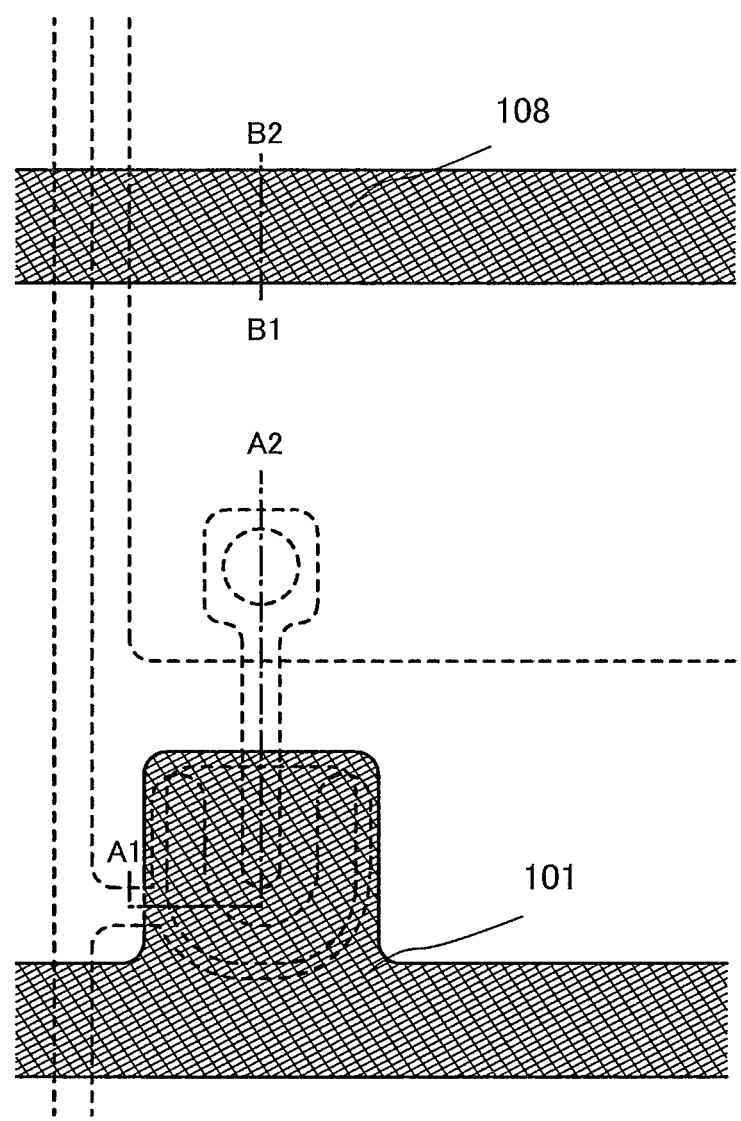
FIG. 6 is a top view of a semiconductor device of an embodiment of the present invention.

Next, a conductive layer is formed over the entire surface of the substrate 100. After that, a first photolithography step is performed to form a resist mask, and unnecessary portions are removed by etching, thereby forming wirings and an electrode (a gate wiring including a gate electrode layer 101, a capacitor wiring 108, and a first terminal 121). At this time, the etching is performed so that at least end portions of the gate electrode layer 101 have a tapered shape. A cross-sectional view at this stage is illustrated in FIG. 4A. Note that a top view at this stage corresponds to FIG. 6.

The gate wiring including the gate electrode layer 101, the capacitor wiring 108, and the first terminal 121 of a terminal portion are preferably formed from a conductive material having low resistance, such as aluminum (Al) or copper (Cu). However, since use of aluminum alone brings disadvantages such as low heat resistance and a tendency to be corroded, aluminum is used in combination with a conductive material having heat resistance. As the conductive material having heat resistance, any of the following materials may be used: an element selected from titanium (Ti), tantalum (Ta), tungsten (W), molybdenum (Mo), chromium (Cr), and neodymium (Nd), scandium (Sc), an alloy containing any of these above elements as a component, an alloy containing these elements in combination, and a nitride containing any of these above elements as a component.

Next, a gate insulating layer 102 is formed over the entire surface of the gate electrode layer 101. The gate insulating layer 102 is formed to a thickness of 50 to 250 nm by a PCVD method, a sputtering method, or the like.

For example, for the gate insulating layer 102, a 100-nm-thick silicon oxide film is formed by a PCVD method or a sputtering method. Needless to say, the gate insulating layer 102 is not limited to such a film and may be a single layer or a stack of any other types of insulating films such as a silicon oxynitride film, a silicon nitride film, an aluminum oxide film, and a tantalum oxide film.

Next, a second photolithography step is performed to form a resist mask and unnecessary portions are removed by etching, thereby forming a contact hole which includes the same material as that of the gate electrode layer and reaches the wiring or the electrode. For example, a contact hole is formed when a thin film transistor whose gate electrode is in direct contact with the source or drain electrode in the driving circuit is formed, or when a terminal that is electrically connected to a gate wiring of a terminal portion is formed.

Next, a conductive film formed of a metal material is formed by a sputtering method or a vacuum evaporation method. Here, the conductive film has a three-layer structure of a Ti film, an aluminum film containing Nd, and a Ti film. As a material of the conductive film, an element selected from Al, Cr, Ta, Ti, Mo, and W; an alloy containing the above element as a component; and an alloy film in which the above elements are combined are given. Alternatively, the conductive film may have a two-later structure, and in such a case, a titanium film may be stacked over an aluminum film. Further alternatively, the conductive film may have a single-layer structure of an aluminum film containing silicon or a titanium film.

Figure 7:
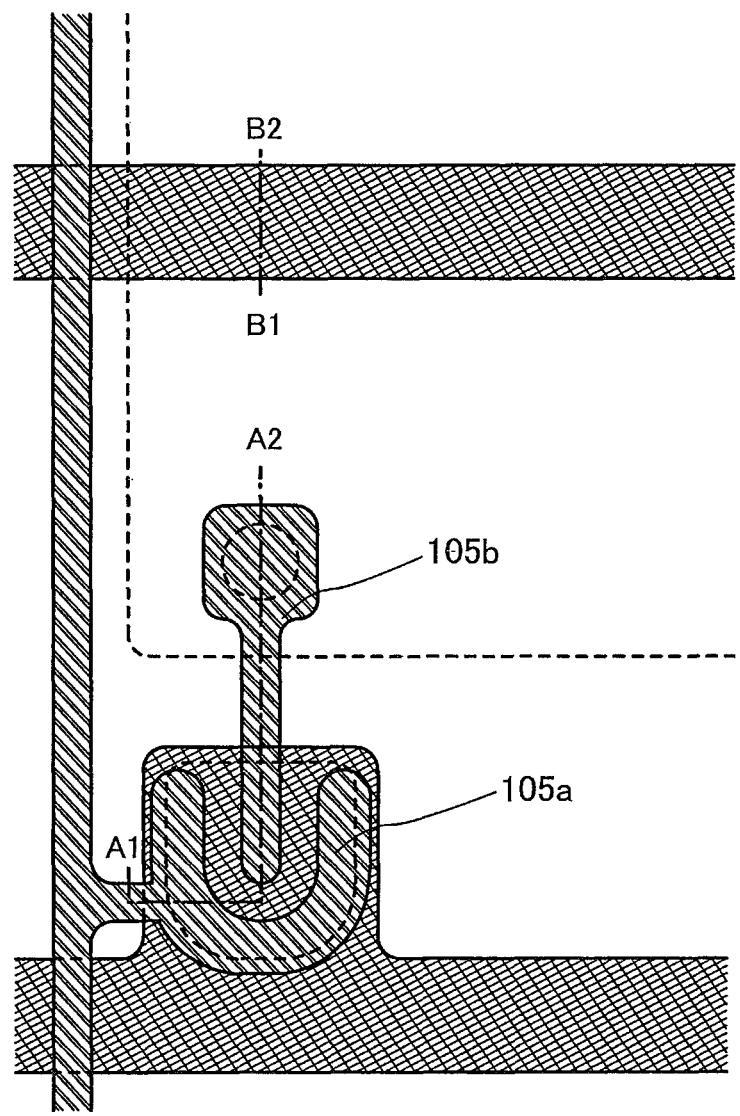
FIG. 7 is a top view of a semiconductor device of an embodiment of the present invention.

Next, a third photolithography step is performed to form a resist mask and unnecessary portions are removed by etching, thereby forming source or drain electrode layers 105a and 105b and a connection electrode 120. Wet etching or dry etching is used as an etching method at this time. Here, the Ti film is etched using an ammonia hydrogen peroxide mixture (with the ratio of hydrogen peroxide to ammonia and water being 5:2:2) as an etchant and the aluminum film containing Nd is etched using a mixed solution of phosphoric acid, acetic acid, and nitric acid as an etchant. A conductive film in which the Ti film, the Al—Nd film, and the Ti film are sequentially stacked is etched by this etching to form the source or drain electrode layers 105a and 105b. A cross-sectional view at this stage is illustrated in FIG. 4B. Note that FIG. 7 is a top view at this stage.

In the terminal portion, the connection electrode 120 is directly connected to the first terminal 121 through the contact hole formed in the gate insulating layer. Note that, although not illustrated here, a source wiring or a drain wiring of a thin film transistor of a driver circuit is directly connected to the gate electrode through the same process as the above.

Next, plasma treatment is performed after the resist mask is removed. A cross-sectional view at this stage is illustrated in FIG. 4C. Here, by reverse sputtering in which plasma is generated by an RF power supply by introduction of an argon gas, plasma treatment is performed on the exposed gate insulating layer.

Next, after the plasma treatment, an oxide semiconductor film is formed without exposure to air. Formation of the oxide semiconductor film without exposure to air after the plasma treatment is effective in preventing dust and moisture from attaching to the interface between the gate insulating layer and the oxide semiconductor film. In Embodiment 3, the oxide semiconductor film is formed in an argon or oxygen atmosphere using an oxide semiconductor target containing In, Ga, and Zn and having a diameter of 8 inches ($In_2O_3$:$Ga_2O_3$:ZnO=1:1:1), with the distance between the substrate and the target set to 170 mm, under a pressure of 0.4 Pa, and with a direct-current (DC) power source of 0.5 kW. Note that it is preferable to use a pulsed direct-current (DC) power source with which dust can be reduced and thickness distribution can be evened. The oxide semiconductor film has a thickness of 5 nm to 200 nm. In Embodiment 3, the thickness of the oxide semiconductor film is 100 nm.

The oxide semiconductor film may be formed in the same chamber as that in which reverse sputtering has been performed, or may be formed in a chamber different from that in which reverse sputtering has been performed as long as it can be formed without exposure to air.

Next, a fourth photolithography step is performed to form a resist mask, and an unnecessary portion is removed by etching to form an oxide semiconductor layer 103. Here, the unnecessary portion is removed by wet etching using ITO-07N (KANTO CHEMICAL CO., INC.) to form the oxide semiconductor layer 103. Note that the etching here may be dry etching without being limited to wet etching. After that, the resist mask is removed.

Figure 8:
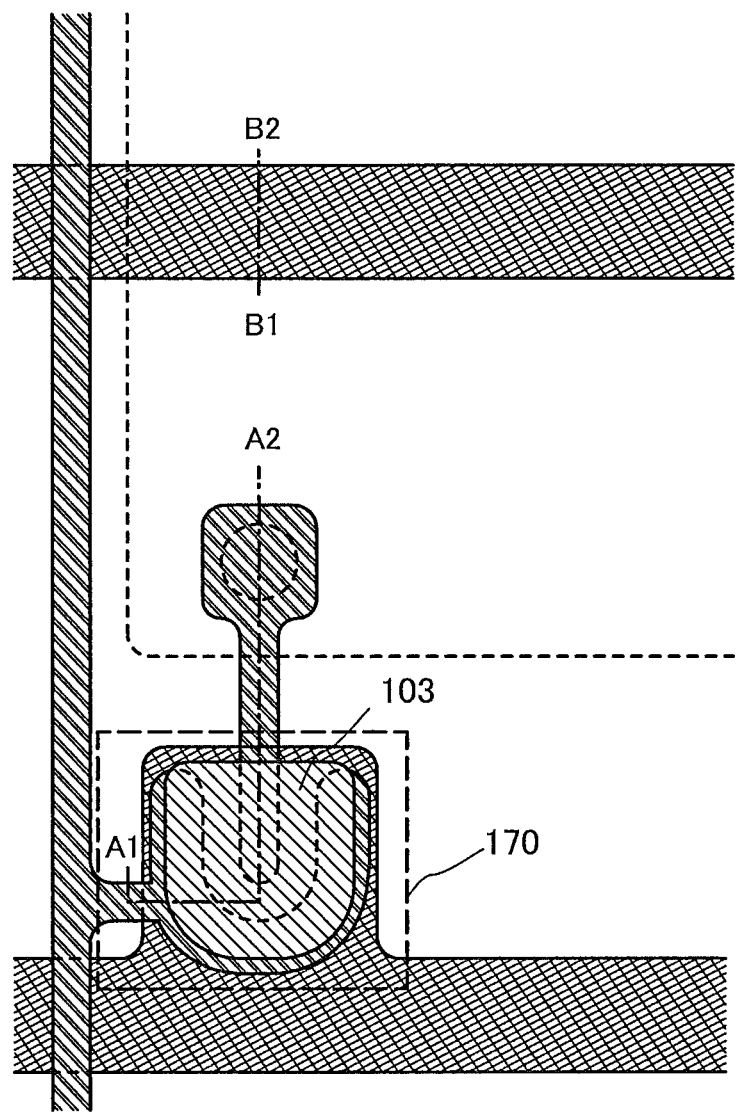
FIG. 8 is a top view of a semiconductor device of an embodiment of the present invention.

Next, heat treatment is preferably performed at 200° C. to 600° C., typically, 300° C. to 500° C. For example, heat treatment is performed in a nitrogen atmosphere in a furnace at 350° C. for 1 hour. Through the above steps, a thin film transistor 170 in which the oxide semiconductor layer 103 serves as a channel formation region can be manufactured. A cross-sectional view at this point is illustrated in FIG. 5A. A top view at this stage corresponds to FIG. 8. In addition, the cross-sectional view of FIG. 5A corresponds to FIG. 3B illustrating the manufacturing process of the driver circuit described in Embodiment 2. Note that the timing of the heat treatment is not particularly limited as long as it is after the formation of the oxide semiconductor film. The heat treatment may be performed, for example, after formation of a protective insulating film.

Next, a protective insulating film 107 for covering the oxide semiconductor layer 103 is formed. For the protective insulating film 107, a silicon nitride film, a silicon oxide film, a silicon oxynitride film, an aluminum oxide film, a tantalum oxide film, or the like which is obtained by a sputtering method or the like can be used. In addition, oxygen radical treatment is preferably performed on a surface of the oxide semiconductor layer 103 before the protective insulating film 107 is formed. Plasma treatment or reverse sputtering may be performed as the oxygen radical treatment performed on the oxide semiconductor layer 103. The reverse sputtering is a method in which voltage is applied to a substrate side, not to a target side, in an oxygen atmosphere or an atmosphere containing oxygen and argon and plasma is generated so that a substrate surface is modified. By the oxygen radical treatment performed on the surface of the oxide semiconductor layer 103, a threshold voltage of the thin film transistor 170 can be positive, whereby a so-called normally-off switching element can be realized. It is desirable, for a display device, that a channel be formed under such a condition that the gate voltage of the thin film transistor is a threshold voltage that is positive and as close to 0 V as possible. Note that if the threshold voltage of the thin film transistor is negative, the thin film transistor is likely to be a so-called normally-on transistor in which current flows between a source electrode and a drain electrode even at a gate voltage of 0 V.

Next, a fifth photolithography step is performed to form a resist mask, and the protective insulating film 107 is etched to form a contact hole 125 which reaches the drain electrode layer 105b. After that, the resist mask is removed. In addition, by the etching here, a contact hole 127 which reaches the second terminal 122 is also formed. Note that in order to reduce the number of masks, the gate insulating layer is preferably etched using the same resist mask so that a contact hole 126 which reaches the gate electrode is formed using the same resist mask. A cross-sectional view at this stage is illustrated in FIG. 5B.

Next, a transparent conductive film is formed over the protective insulating film 107. The transparent conductive film is formed using indium oxide ($In_2O_3$), an alloy of indium oxide and tin oxide ($In_2O_3$—$SnO_2$, abbreviated as ITO), or the like by a sputtering method, a vacuum evaporation method, or the like. Etching treatment of such a material is performed with a hydrochloric acid based solution. Instead, because a residue tends to be generated particularly in etching of ITO, an alloy of indium oxide and zinc oxide ($In_2O_3$—ZnO) may be used in order to improve etching processability.

Next, a sixth photolithography step is performed to form a resist mask and unnecessary portions are removed by etching, thereby forming a pixel electrode layer 110.

Further, in this sixth photolithography step, a storage capacitor is formed with the capacitor wiring 108 and the pixel electrode layer 110, in which the gate insulating layer 102 and the protective insulating film 107 in the capacitor portion are used as a dielectric.

In addition, in this seventh photolithography step, upper portions of the first terminal and the second terminal are covered with the resist mask so that transparent conductive films 128 and 129 are left in the terminal portion. The transparent conductive films 128 and 129 serve as electrodes or wirings that are used for connection with an FPC. The transparent conductive film 128 formed over the connection electrode 120 that is directly connected to the first terminal 121 serves as a terminal electrode for connection which functions as an input terminal for the gate wiring. The transparent conductive film 129 formed over the second terminal 122 serves as a terminal electrode for connection which functions as an input terminal for the source wiring.

Next, the resist mask is removed, and a cross-sectional view at this stage is illustrated in FIG. 5C. Note that a top view at this stage corresponds to FIG. 9. In addition, the cross-sectional view of FIG. 5C corresponds to FIG. 3C illustrating the manufacturing step of the driver circuit described in Embodiment 2.

Figure 10A:
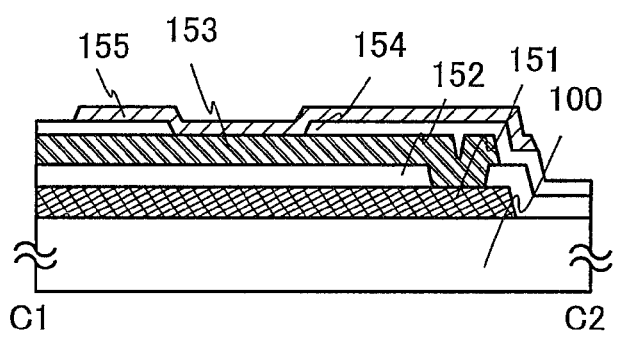
FIGS. 10A and 10B are each a cross-sectional view of a semiconductor device of an embodiment of the present invention and FIGS. 10C and 10D are top views of the same.
Figure 10C:
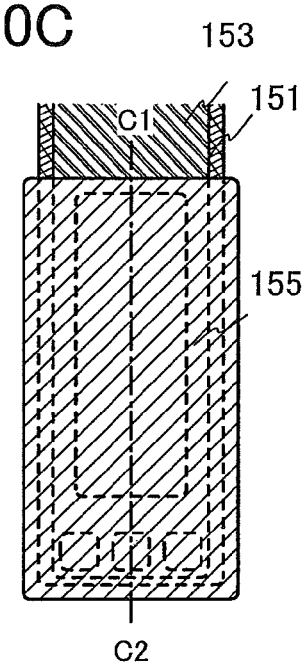

Further, FIGS. 10A and 10C are a cross-sectional view of a gate wiring terminal portion at this stage and a top view thereof, respectively. FIG. 10A is a cross-sectional view taken along the line C1-C2 of FIG. 10C. In FIG. 10A, a transparent conductive film 155 formed over a protective insulating film 154 is a connection terminal electrode which functions as an input terminal. Furthermore, in FIG. 10A, in the terminal portion, the first terminal 151 formed from the same material as the gate wiring and the connection electrode 153 formed from the same material as the source wiring are overlapped with each other with the gate insulating layer 152 therebetween, and the first terminal 151 and the connection electrode 153 are in direct contact with each other through a contact hole provided in the gate insulating layer 152 to form conduction therebetween. In addition, the connection electrode 153 and the transparent conductive film 155 are in direct contact with each other through a contact hole provided in the protective insulating film 154 to form conduction therebetween.

Figure 10B:
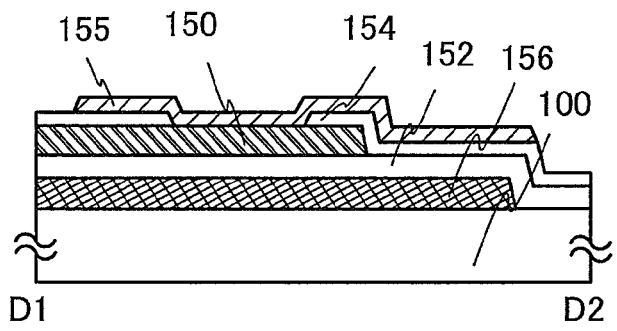
Figure 10D:
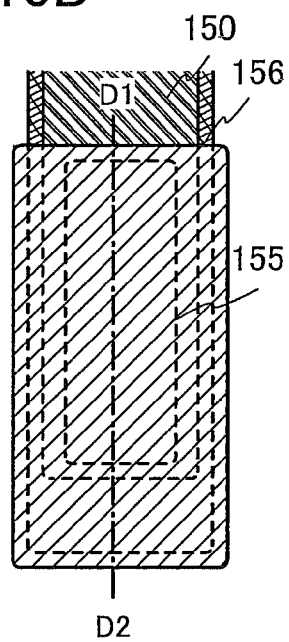

Further, FIGS. 10B and 10D are a cross-sectional view of a source wiring terminal portion at this stage and a top view thereof, respectively. In addition, FIG. 10B corresponds to a cross-sectional view taken along the line G1-G2 in FIG. 10D. In FIG. 10B, the transparent conductive film 155 formed over the protective insulating film 154 is a connection terminal electrode which functions as an input terminal. Furthermore, in FIG. 10B, in the terminal portion, an electrode 156 formed from the same material as the gate wiring is located below and overlapped with the second terminal 150, which is electrically connected to the source wiring, with the gate insulating layer 152 interposed therebetween. The electrode 156 is not electrically connected to the second terminal 150. When the electrode 156 is set to, for example, floating, GND, or 0 V such that the potential the electrode 156 is different from the potential of the second terminal 150, a capacitor for preventing noise or static electricity can be formed. In addition, the second terminal 150 is electrically connected to the transparent conductive film 155 with the protective insulating film 154 interposed therebetween.

A plurality of gate wirings, source wirings, and capacitor wirings are provided depending on the pixel density. Also in the terminal portion, the first terminal at the same potential as the gate wiring, the second terminal at the same potential as the source wiring, the third terminal at the same potential as the capacitor wiring, and the like are each arranged in plurality. There is no particular limitation on the number of each of the terminals, and the number of the terminals may be determined by a practitioner as appropriate.

Through these six photolithography steps, a pixel portion including the bottom-gate thin film transistor 170, and the storage capacitor can be completed using the six photomasks. When these pixel thin film transistor portion and storage capacitor are arranged in a matrix corresponding to respective pixels, a pixel portion can be formed and one of the substrates for manufacturing an active matrix display device can be obtained. In this specification, such a substrate is referred to as an active matrix substrate for convenience.

When an active matrix liquid crystal display device is manufactured, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. This fourth terminal is provided so that the common electrode is fixed to a predetermined potential such as GND or 0 V.

Figure 9:
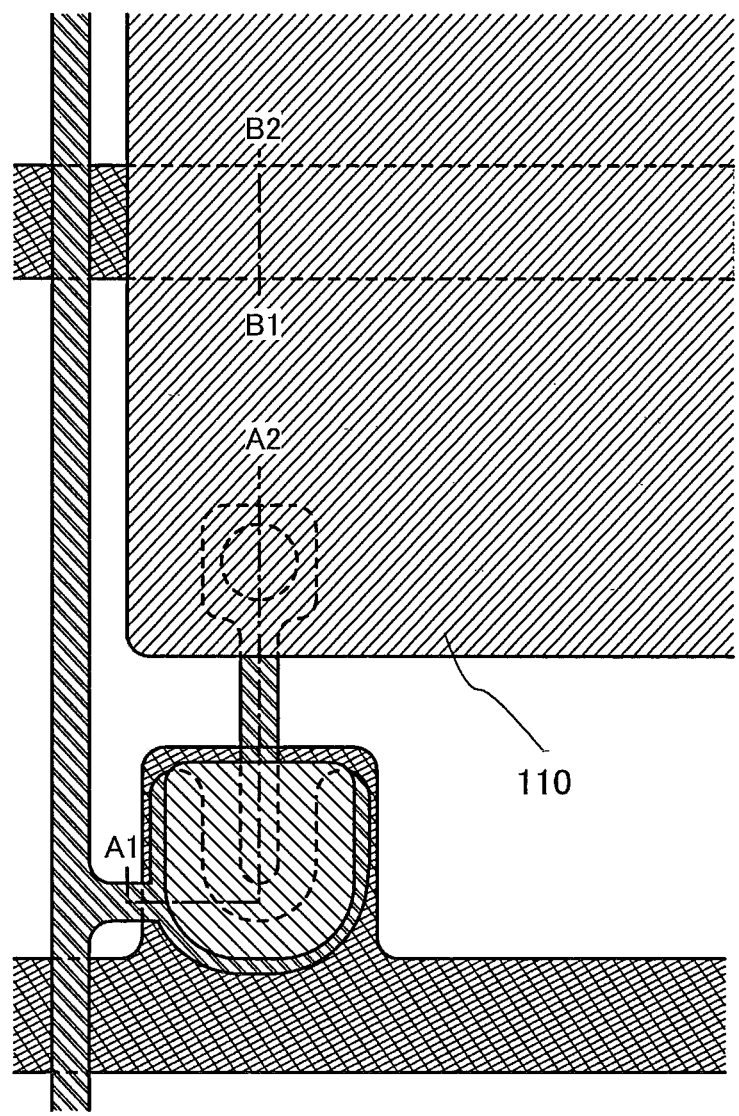
FIG. 9 is a top view of a semiconductor device of an embodiment of the present invention.
Figure 11:
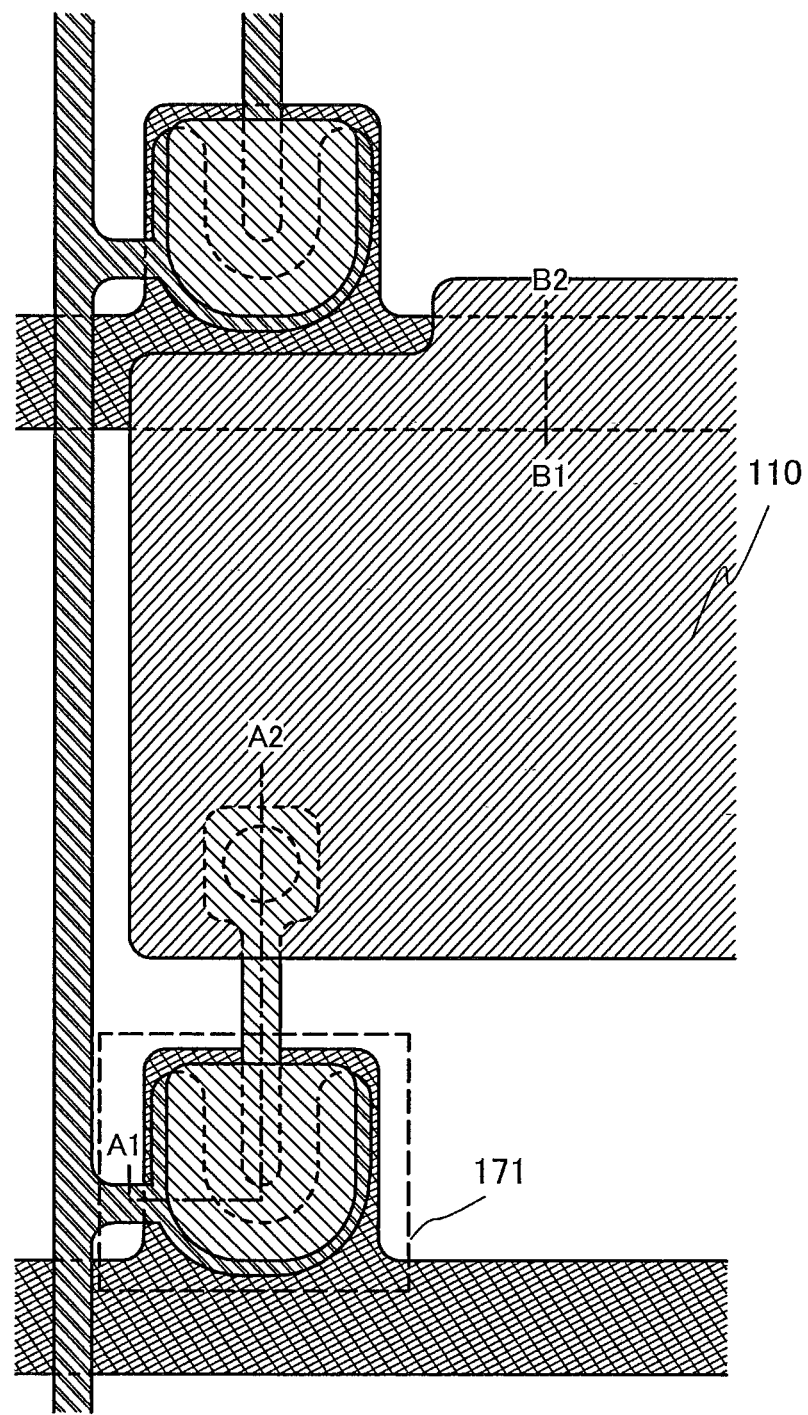
FIG. 11 is a top view of a pixel of a semiconductor device of an embodiment of the present invention.

Further, an embodiment of the present invention is not limited to a pixel structure in FIG. 9, and an example of a top view different from FIG. 9 is illustrated in FIG. 11. FIG. 11 illustrates an example in which a capacitor wiring is not provided and a storage capacitor is formed with a pixel electrode and a gate wiring of an adjacent pixel which are overlapped with each other with a protective insulating film and a gate insulating layer interposed therebetween. In this case, the capacitor wiring and the third terminal connected to the capacitor wiring can be omitted. Note that in FIG. 11, portions similar to those in FIG. 9 are denoted by the same reference numerals.

In an active matrix liquid crystal display device, pixel electrodes arranged in a matrix are driven to form a display pattern on a screen. Specifically, a voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Further, there is another driving technique which is so-called double-frame rate driving. In the double-frame rate driving, a vertical cycle is set 1.5 times as much as a normal vertical cycle or more (preferably 2 times or more), whereby moving image characteristics are improved.

Further alternatively, in order to improve the moving-image characteristics of a liquid crystal display device, a driving method may be employed in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

The n-channel transistor obtained in Embodiment 3 includes an In—Ga—Zn—O-based non-single-crystal film in a channel formation region and has good dynamic characteristics. Thus, these driving methods can be applied in combination to the n-channel transistor of this embodiment.

When a light-emitting display device is manufactured, one electrode (also referred to as a cathode) of an organic light-emitting element is set to a low power supply potential such as GND or 0 V; therefore, a terminal portion is provided with a fourth terminal for setting the cathode to a low power supply potential such as GND or 0 V. In addition, when a light-emitting display device is manufactured, a power supply line is provided in addition to a source wiring and a gate wiring. Therefore, a terminal portion is provided with a fifth terminal electrically connected to the power supply line.

Embodiment 3 can be freely combined with Embodiment 1 or 2.

(Embodiment 4)

In Embodiment 4, an example of an electronic paper will be described as a semiconductor device of an embodiment of the present invention.

Figure 12:
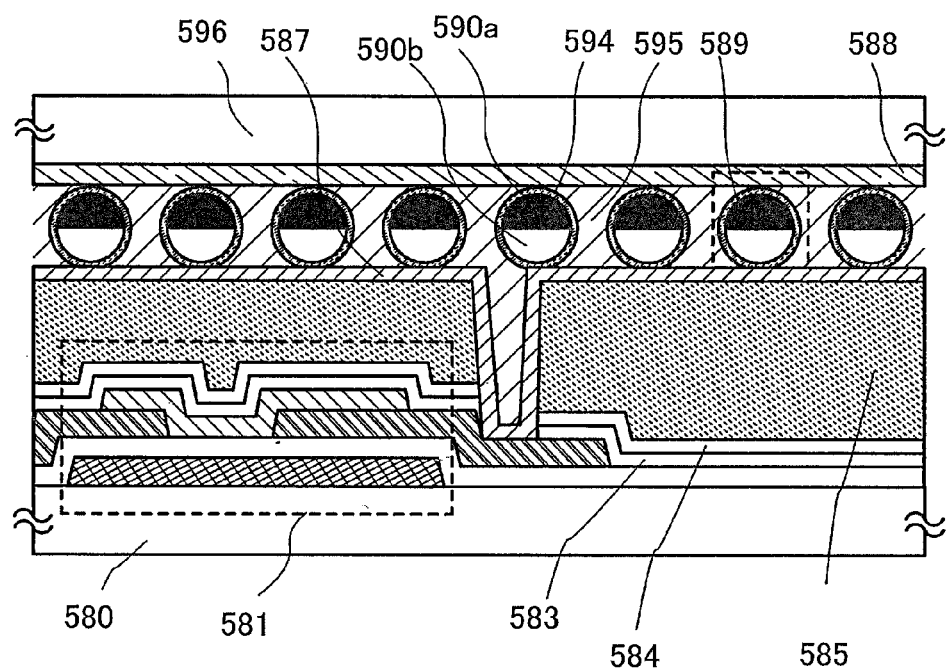
FIG. 12 is a cross-sectional view of an electronic paper.

FIG. 12 illustrates an active matrix electronic paper as an example of a semiconductor device to which an embodiment of the present invention is applied. A thin film transistor 581 used for the semiconductor device can be manufactured in a manner similar to that of the thin film transistor 170 described in Embodiment 3 and is a thin film transistor with high electrical characteristics including an oxide semiconductor layer over a gate insulating layer, a source electrode layer, and a drain electrode layer.

The electronic paper in FIG. 12 is an example of a display device using a twisting ball display system. The twisting ball display system refers to a method in which spherical particles each colored in black or white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 is a thin film transistor with a bottom gate structure, and a source or drain electrode layer thereof is in contact with a first electrode layer 587 through an opening formed in insulating layers 583, 584, and 585, whereby the thin film transistor 581 is electrically connected to the first electrode layer 587. Between the first electrode layer 587 and a second electrode layer 588, spherical particles 589 each having a black region 590*a*, a white region 590*b*, and a cavity 594 around the regions which is filled with liquid are provided. A space around the spherical particles 589 is filled with a filler 595 such as a resin (see FIG. 12). In Embodiment 8, the first electrode layer 587 corresponds to a pixel electrode, and the second electrode layer 588 corresponds to a common electrode.

Instead of the twisting ball, an electrophoretic element can also be used. A microcapsule having a diameter of about 10 to 200 μm in which transparent liquid, positively-charged white microparticles, and negatively-charged black microparticles are encapsulated, is used. In the microcapsule which is provided between the first electrode layer and the second electrode layer, when an electric field is applied between the first electrode layer and the second electrode layer, the white microparticles and the black microparticles move to opposite sides from each other, so that white or black can be displayed. A display element using this principle is an electrophoretic display element and is generally called an electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, a highly reliable electronic paper as a semiconductor device can be manufactured.

Embodiment 4 can be implemented in appropriate combination with the driver circuit or the pixel portion described in any one of Embodiments 1 to 3.

(Embodiment 5)

In Embodiment 5, an example will be described below, in which at least part of a driver circuit and a thin film transistor arranged in a pixel portion are formed over the same substrate in a display device which is one example of a semiconductor device of an embodiment of the present invention.

The thin film transistor to be arranged in the pixel portion is formed according to Embodiment 3. Further, the thin film transistor 170 described in Embodiment 3 is an n-channel TFT, and thus a part of a driver circuit that can include an n-channel TFT among driver circuits is formed over the same substrate as the thin film transistor of the pixel portion.

Figure 13A:
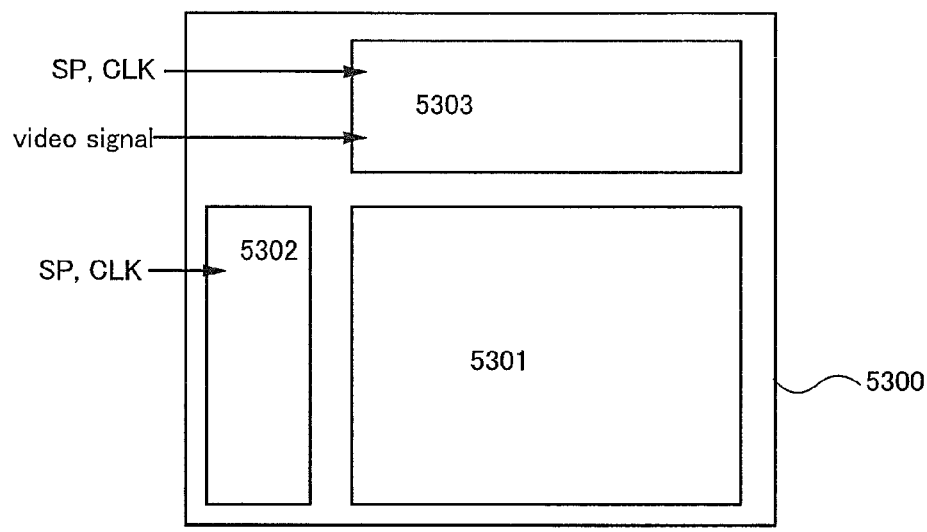
FIGS. 13A and 13B are block diagrams of a semiconductor device.

FIG. 13A is an example of a block diagram of an active matrix liquid crystal display device which is an example of a semiconductor device of an embodiment of the present invention. The display device illustrated in FIG. 13A includes, over a substrate 5300, a pixel portion 5301 including a plurality of pixels that are each provided with a display element; a gate line driver circuit 5302 that selects a pixel; and a source line driver circuit 5303 that controls a video signal input to the selected pixel.

In addition, the thin film transistor 170 described in Embodiment 3 is an n-channel TFT, and a source line driver circuit including the n-channel TFT is described with reference to FIG. 14.

Figure 14:
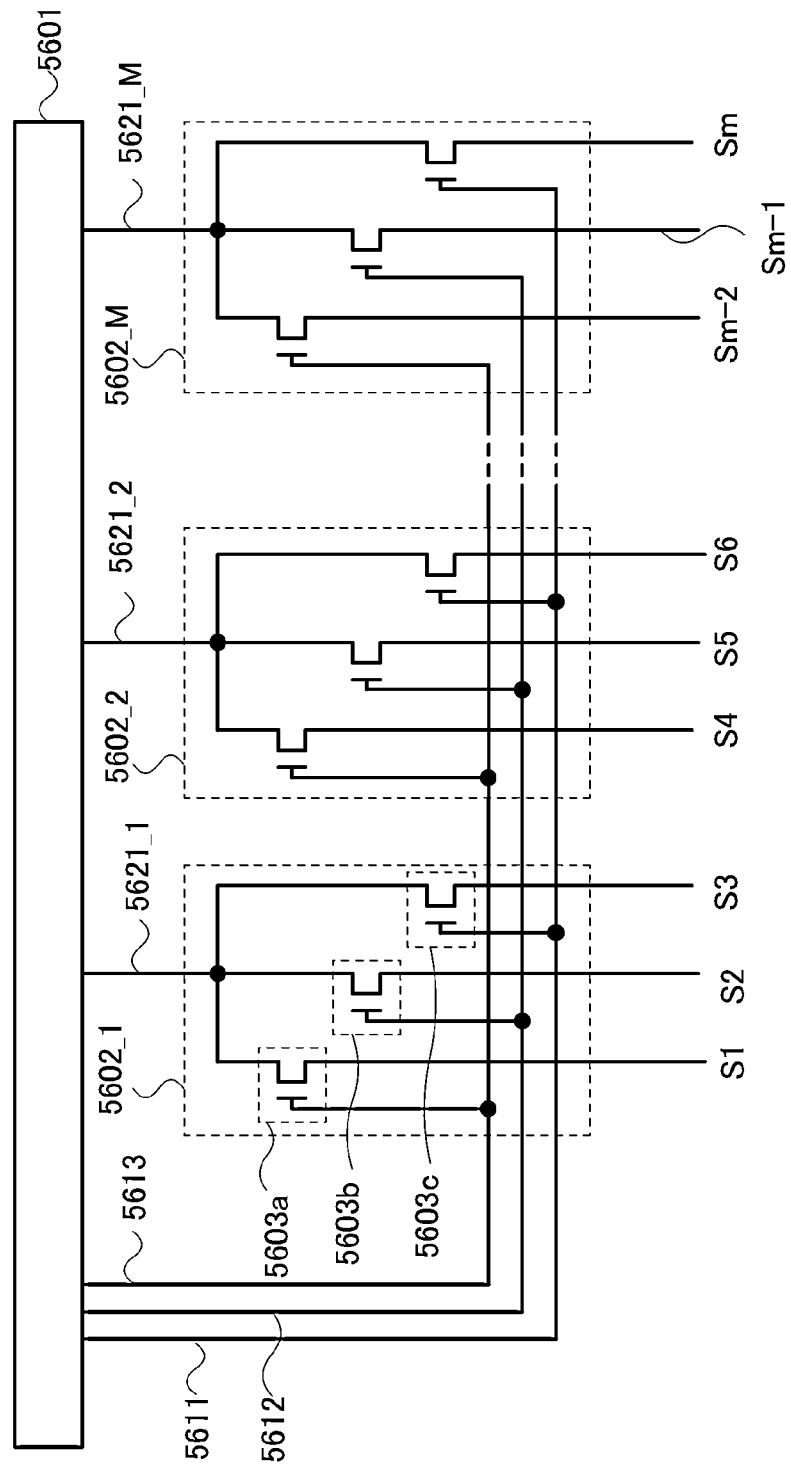
FIG. 14 is a diagram illustrating a source line driver circuit.

The source line driver circuit illustrated in FIG. 14 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The pixel portion 5301 is connected to the source line driver circuit 5303 by a plurality of signal lines S1 to Sm (not illustrated) that extend in a column direction from the source line driver circuit 5303, and to the gate line driver circuit 5302 by a plurality of scan lines G1 to Gn (not illustrated) that extend in a row direction from the gate line driver circuit 5302. The pixel portion 5301 includes a plurality of pixels (not illustrated) arranged in matrix so as to correspond to the signal lines S1 to Sm and the scan lines G1 to Gn. Each pixel is connected to a signal line Sj (one of the signal lines S1 to Sm) and a scan line Gj (one of the scan lines G1 to Gn).

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the wirings 5621_1 to 5621_M are connected to the switch groups 5602_1 to 5602_M, respectively. Each of the wirings 5621_1 to 5621_M is connected to three signal lines via the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−1, a signal line Sj, and a signal line Sj+1 via the first thin film transistor 5603a, the second thin film transistor 5603b, and the third thin film transistor 5603c which are included in the switch group 5602_J.

Note that a signal is inputted to each of the first wiring 5611, the second wiring 5612, and the third wiring 5613.

Note that the driver IC 5601 is preferably formed over a single crystalline substrate. The switch groups 5602_1 to 5602_M are preferably formed over the same substrate as the pixel portion is. Therefore, the driver IC 5601 and the switch groups 5602_1 to 5602_M are preferably connected through an FPC or the like.

Figure 15:
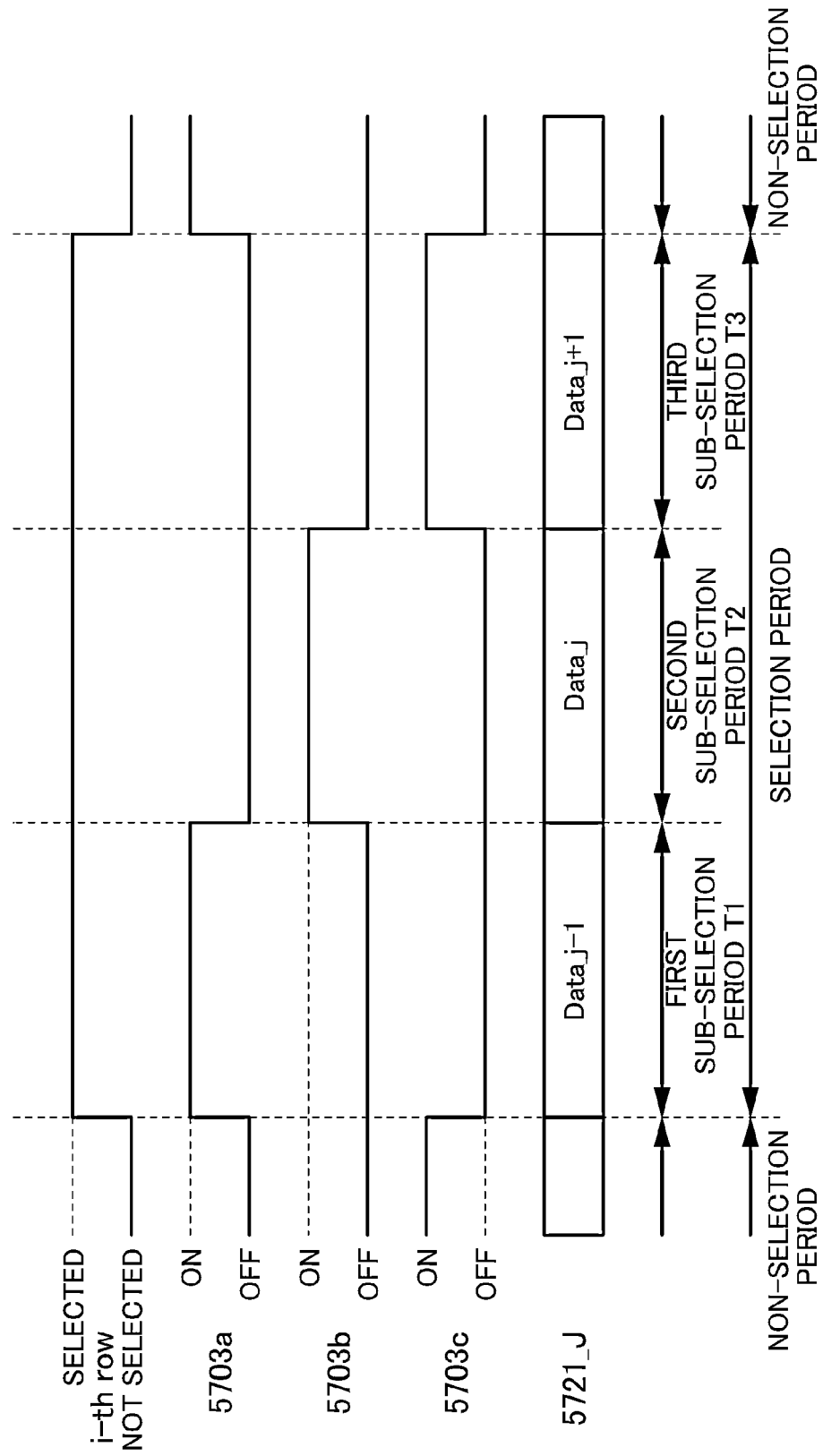
FIG. 15 is a timing chart illustrating operation of a source line driver circuit.

Next, operation of the source line driver circuit illustrated in FIG. 14 is described with reference to a timing chart in FIG. 15. The timing chart in FIG. 15 illustrates a case where the scan line Gi of the i-th row is selected. A selection period of the scan line Gi of the i-th row is divided into a first sub-selection period T1, a second sub-selection period T2, and a third sub-selection period T3. In addition, the source line driver circuit in FIG. 14 operates similarly to that in FIG. 15 even when a scan line of another row is selected.

Note that the timing chart in FIG. 15 shows a case where the wiring 5621_J of the J-th column is connected to the signal line Sj−1, the signal line Sj, and the signal line Sj+1 via the first thin film transistor 5603a, the second thin film transistor 5603b, and the third thin film transistor 5603c.

The timing chart in FIG. 15 shows timing at which the scan line Gi of the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. In addition, the video signals input to the wiring 5621_J in the first sub-selection period T1, the second sub-selection period T2, and the third sub-selection period T3 are denoted by Data_j−1, Data_j, and Data_j+1

As illustrated in FIG. 15, in the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the source line driver circuit in FIG. 14, by dividing one gate selection period into three, video signals can be input to three signal lines from one wiring 5621 in one gate selection period. Therefore, in the source line driver circuit in FIG. 14, the number of connections between the substrate provided with the driver IC 5601 and the substrate provided with the pixel portion can be approximately ⅓ of the number of signal lines. The number of connections is reduced to approximately ⅓ of the number of the signal lines, so that reliability, yield, etc., of the source line driver circuit in FIG. 14 can be improved.

Note that there are no particular limitations on the arrangement, the number, a driving method, and the like of the thin film transistors, as long as one gate selection period is divided into a plurality of sub-selection periods and video signals are input to a plurality of signal lines from one wiring in the respective sub-selection periods as illustrated in FIG. 14.

For example, when video signals are input to three or more signal lines from one wiring in each of three or more sub-selection periods, it is only necessary to add a thin film transistor and a wiring for controlling the thin film transistor. Note that when one gate selection period is divided into four or more sub-selection periods, one sub-selection period becomes short. Therefore, one gate selection period is preferably divided into two or three sub-selection periods.

Figure 16:
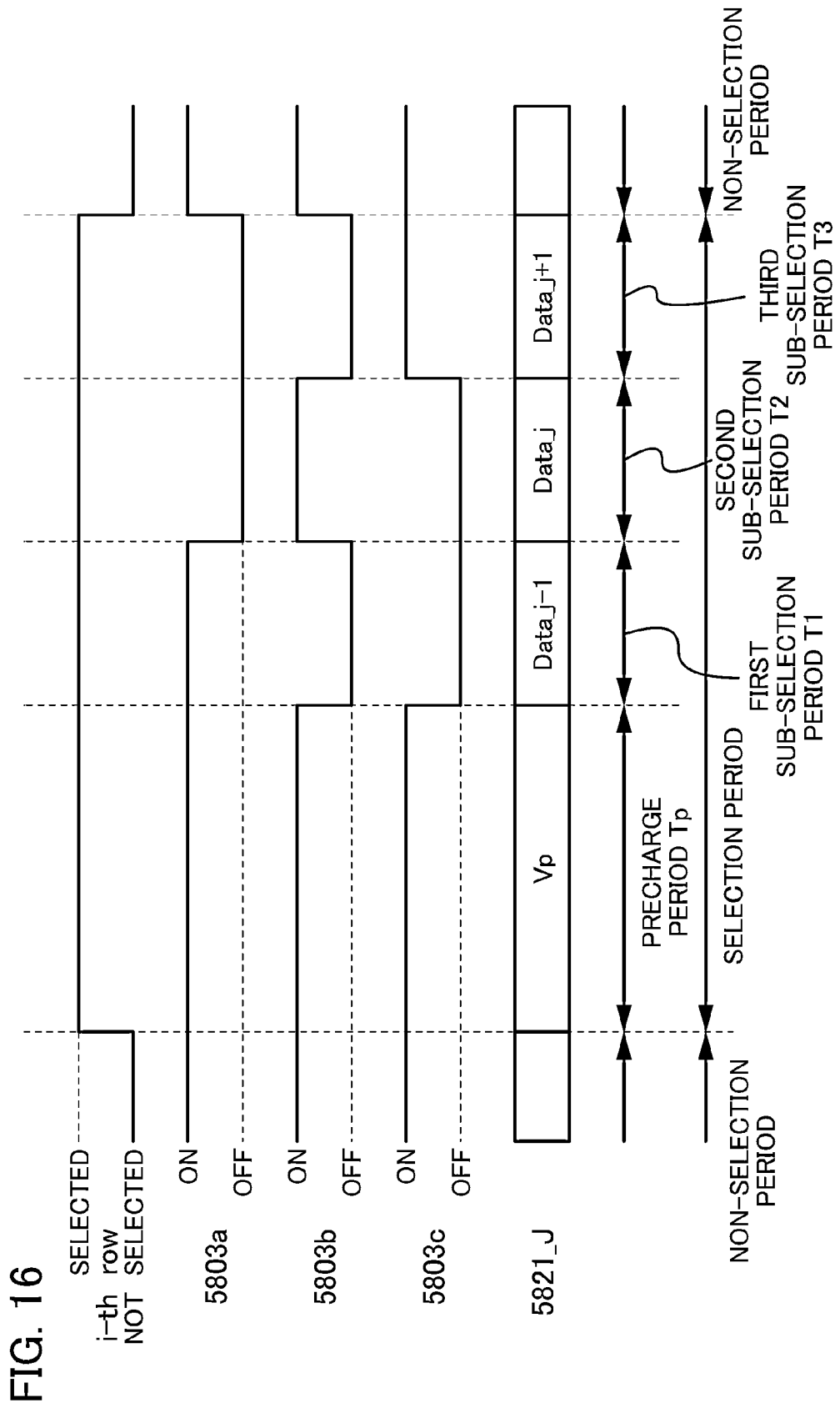
FIG. 16 is a timing chart illustrating operation of a source line driver circuit.

As another example, one gate selection period may be divided into a precharge period Tp, the first sub-selection period T1, the second sub-selection period T2, and the third sub-selection period T3 as shown in a timing chart in FIG. 16. The timing chart in FIG. 16 shows timing at which the scan line Gi of the i-th row is selected, timing 5803a of on/off of the first thin film transistor 5603a, timing 5803b of on/off of the second thin film transistor 5603b, timing 5803c of on/off of the third thin film transistor 5603c, and a signal 5821_J input to the wiring 5621_J of the J-th column. As shown in FIG. 16, the first thin film transistor 5603a, the second thin film transistor 5603b, and the third thin film transistor 5603c are tuned on in the precharge period Tp. At this time, precharge voltage Vp input to the wiring 5621_J is input to each of the signal line Sj−1, the signal line Sj, and the signal line Sj+1 via the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the source line driver circuit in FIG. 14 to which the timing chart in FIG. 16 is applied, the video signal can be written to the pixel at high speed because the signal line can be precharged by providing a precharge selection period before a sub-selection period. Note that portions in FIG. 16 which are similar to those of FIG. 15 are denoted by common reference numerals and detailed description of the same portions and portions which have similar functions is omitted.

Further, a structure of a gate line driver circuit is described. The gate line driver circuit includes a shift register or a buffer. Additionally, the gate line driver circuit may include a level shifter or may include only a shift register in some cases. In the gate line driver circuit, when the clock signal (CLK) and the start pulse signal (SP) are input to the shift register, a selection signal is produced. The selection signal produced is buffered and amplified by the buffer, and the resulting signal is supplied to a corresponding scan line. Gate electrodes of transistors in pixels of one line are connected to the scan line. Further, since the transistors in the pixels of one line have to be turned on at the same time, a buffer which can feed a large current is used.

One mode of a shift register which is used for a part of a gate line driver circuit is described with reference to FIG. 17 and FIG. 18.

Figure 17:
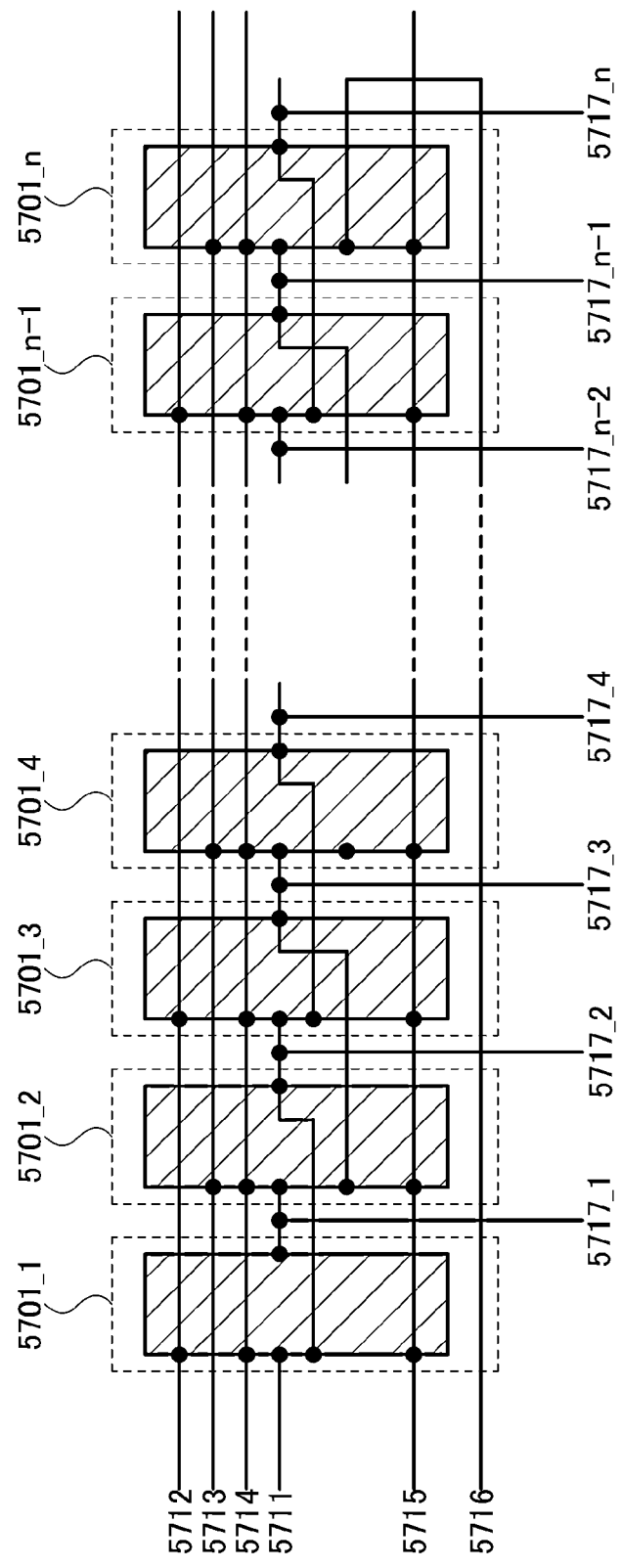
FIG. 17 is a diagram illustrating a structure of a shift register.

FIG. 17 illustrates a circuit configuration of the shift register. The shift register illustrated in FIG. 17 includes a plurality of flip-flops 5701_1 to 5701_n. The shift register is operated with input of a first clock signal, a second clock signal, a start pulse signal, and a reset signal.

Connection relations of the shift register in FIG. 17 are described. In the i-th stage flip-flop 5701_i (one of the flip-flops 5701_1 to 5701_n) in the shift register of FIG. 17, a first wiring 5501 illustrated in FIG. 18 is connected to a seventh wiring 5717_i−1; a second wiring 5502 illustrated in FIG. 18 is connected to a seventh wiring 5717_i+1; a third wiring 5503 illustrated in FIG. 18 is connected to a seventh wiring 5717_i; and a sixth wiring 5506 illustrated in FIG. 18 is connected to a fifth wiring 5715.

Figure 18:
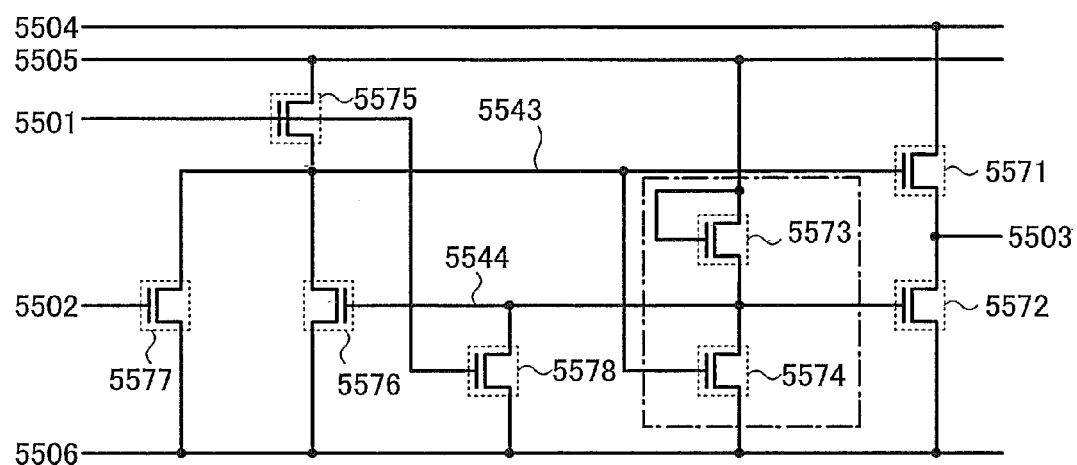
FIG. 18 is a diagram illustrating a connection structure of a flip flop illustrated in FIG. 17.

Further, a fourth wiring 5504 illustrated in FIG. 18 is connected to a second wiring 5712 in flip-flops of odd-numbered stages, and is connected to a third wiring 5713 in flip-flops of even-numbered stages. A fifth wiring 5505 illustrated in FIG. 18 is connected to a fourth wiring 5714.

Note that the first wiring 5501 of the first stage flip-flop 5701_1 illustrated in FIG. 18 is connected to a first wiring 5711. Moreover, the second wiring 5502 of the n-th stage flip-flop 5701_n illustrated in FIG. 18 is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Next, FIG. 18 illustrates details of the flip-flop illustrated in FIG. 17. A flip-flop illustrated in FIG. 18 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

In FIG. 18, a gate electrode of the third thin film transistor 5573 is electrically connected to a power supply line. In addition, a circuit in which the third thin film transistor 5573 and the fourth thin film transistor 5574 are connected to each other (a circuit surrounded by a chain line in FIG. 18) can be said to correspond to the circuit configuration illustrated in FIG. 2A. Although all the thin film transistors here are enhancement type n-channel transistors, there is no particular limitation thereto, and a driver circuit can be driven even if the third thin film transistor 5573 is a depression type n-channel transistor.

Next, connections of the flip-flop illustrated in FIG. 18 are described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505. A second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to the gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In addition, the source line driver circuit and the gate line driver circuit can be formed using only the n-channel TFTs described in Embodiment 3. The n-channel TFT described in Embodiment 3 has a high mobility, and thus a driving frequency of a driver circuit can be increased. Further, parasitic capacitance is reduced by the source or drain region which is an oxygen-deficient oxide semiconductor layer containing indium, gallium, and zinc; thus, the n-channel TFT described in Embodiment 3 has high frequency characteristics. For example, a gate line driver circuit using the n-channel TFT described in Embodiment 3 can operate at high speed, and thus a frame frequency can be increased and insertion of black images can be realized.

In addition, when the channel width of the transistor in the gate line driver circuit is increased or a plurality of gate line driver circuits are provided, for example, higher frame frequency can be realized. When a plurality of gate line driver circuits are provided, a gate line driver circuit for driving scan lines of even-numbered rows is provided on one side and a gate line driver circuit for driving scan lines of odd-numbered rows is provided on the opposite side; thus, increase in frame frequency can be realized. In addition, inputting a signal is to the same scan line by a plurality of gate line driver circuits is advantageous for increase in size of a display device.

Figure 13B:
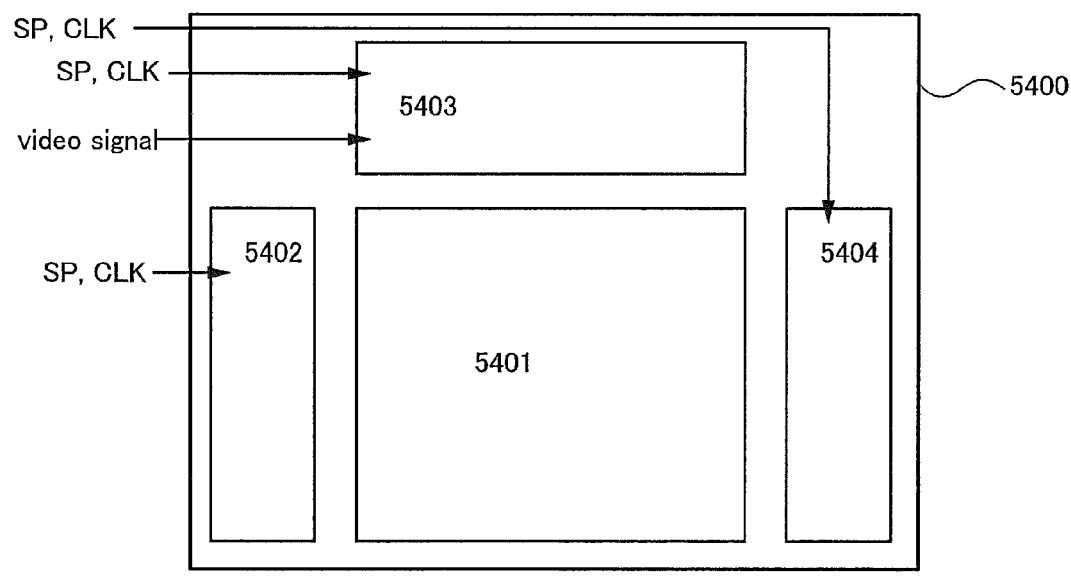

Further, when an active matrix light-emitting display device which is an example of a semiconductor device of an embodiment of the present invention is manufactured, a plurality of thin film transistors are arranged in at least one pixel, and thus a plurality of gate line driver circuits are preferably arranged. FIG. 13B is a block diagram illustrating an example of an active matrix light-emitting display device.

The light-emitting display device illustrated in FIG. 13B includes, over a substrate 5400, a pixel portion 5401 having a plurality of pixels each provided with a display element, a first gate line driver circuit 5402 and a second gate line driver circuit 5404 that select a pixel, and a source line driver circuit 5403 that controls input of a video signal to the selected pixel.

When the video signal input to a pixel of the light-emitting display device illustrated in FIG. 13B is a digital signal, a pixel is in a light-emitting state or in a non-light-emitting state by switching of ON/OFF of a transistor. Thus, grayscale can be displayed using an area ratio grayscale method or a time ratio grayscale method. An area ratio grayscale method refers to a driving method by which one pixel is divided into a plurality of subpixels and the respective subpixels are driven independently based on video signals so that grayscale is displayed. A time ratio grayscale method refers to a driving method by which a period during which a pixel is in a light-emitting state is controlled so that grayscale is displayed.

Since the response speed of light-emitting elements is higher than that of liquid crystal elements or the like, the light-emitting elements are more suitable for a time ratio grayscale method than liquid-crystal display elements. Specifically, in the case of displaying with a time gray scale method, one frame period is divided into a plurality of subframe periods. Then, in accordance with video signals, the light-emitting element in the pixel is set in a light-emitting state or in a non-light-emitting state during each subframe period. By dividing one frame into a plurality of subframes, the total length of time, in which pixels actually emit light in one frame period, can be controlled with video signals so that gray scales are displayed.

In the example of the light-emitting display device illustrated in FIG. 13B, in a case where two switching TFTs are arranged in one pixel, the first gate line driver circuit 5402 generates a signal which is input to a first scan line serving as a gate wiring of one of the switching TFTs, and the second gate line driver circuit 5404 generates a signal which is input to a second scan line serving as a gate wiring of the other switching TFT; however, one gate line driver circuit may generate both the signal which is input to the first scan line and the signal which is input to the second scan line. In addition, for example, there is a possibility that a plurality of the scan lines used for controlling the operation of the switching element are provided in each pixel, depending on the number of switching TFTs included in one element. In that case, one gate line driver circuit may generate all signals that are input to the plurality of first scan lines, or a plurality of gate line driver circuits may generate signals that are input to the plurality of first scan lines.

In addition, also in the light-emitting display device, a part of the driver circuit that can include n-channel TFTs among driver circuits can be formed over the same substrate as the thin film transistors of the pixel portion. Alternatively, the source line driver circuit and the gate line driver circuit can be formed using only the n-channel TFTs described in Embodiment 3.

Moreover, the above-described driver circuit can be used for an electronic paper that drives electronic ink using an element electrically connected to a switching element, without being limited to applications to a liquid crystal display device or a light-emitting display device. The electronic paper is also referred to as an electrophoretic display device (electrophoretic display) and has advantages in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules are moved in opposite directions to each other and only the color of the particles concentrated on one side is exhibited. Note that the first particles and the second particles each contain pigment and do not move without an electric field. Moreover, the colors of the first particles and the second particles are different from each other (the colors include colorless or achroma).

In this way, an electrophoretic display is a display that utilizes a so-called dielectrophoretic effect by which a substance that has a high dielectric constant moves to a high-electric field region. An electrophoretic display does not need to have a polarizer and a counter substrate, which are required in a liquid crystal display device, and both the thickness and weight of the electrophoretic display device can be a half of those of a liquid crystal display device.

A solution in which the aforementioned microcapsules are dispersed throughout a solvent is referred to as electronic ink. This electronic ink can be printed on a surface of glass, plastic, cloth, paper, or the like. Furthermore, by use of a color filter or particles that have a pigment, color display is possible, as well.

In addition, if a plurality of the aforementioned microcapsules are arranged as appropriate over an active matrix substrate so as to be interposed between two electrodes, an active matrix display device can be completed, and display can be performed by application of an electric field to the microcapsules. For example, the active matrix substrate obtained with the thin film transistor described in Embodiment 3 and the driver circuit described in Embodiment 2 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, or a magnetophoretic material or formed of a composite material of any of these.

Through the above steps, a highly reliable display device as a semiconductor device can be manufactured.

This embodiment can be combined with any of the other embodiments as appropriate.

(Embodiment 6)

A thin film transistor is manufactured using an oxide semiconductor layer, and a semiconductor device having a display function (also referred to as a "display device") can be manufactured using the thin film transistor in a pixel portion and further in a driver circuit. Further, part or whole of a driver circuit can be formed over the same substrate as a pixel portion, using the inverter circuit described in Embodiment 1 or 2, whereby a system-on-panel can be obtained.

The display device includes a display element. As the display element, a liquid crystal element (also referred to as a "liquid crystal display element") or a light-emitting element (also referred to as a "light-emitting display element") can be used. Light-emitting elements include, in its category, an element whose luminance is controlled by current or voltage, and specifically include an inorganic electroluminescent (EL) element, an organic EL element, and the like. Further, a display medium whose contrast is changed by an electric effect, such as an electronic ink, can be used.

In addition, the display device includes a panel in which the display element is sealed, and a module in which an IC including a controller or the like is mounted on the panel. An embodiment of the present invention relates to one embodiment of an element substrate before the display element is completed in a manufacturing process of the display device, and the element substrate is provided with means for supplying current to the display element in each of a plurality of pixels. Specifically, the element substrate may be in a state provided with only a pixel electrode of the display element, a state after a conductive film to be a pixel electrode is formed and before the conductive film is etched to form the pixel electrode, or any of other states.

Note that a display device in this specification means an image display device, a display device, or a light source (including a lighting device). Further, the display device includes any of the following modules in its category: a module to which a connector such as a flexible printed circuit (FPC), tape automated bonding (TAB) tape, or a tape carrier package (TCP) is attached; a module having TAB tape or a TCP which is provided with a printed wiring board at the end thereof; and a module having an integrated circuit (IC) which is directly mounted on a display element by a chip on glass (COG) method.

Figure 19A:
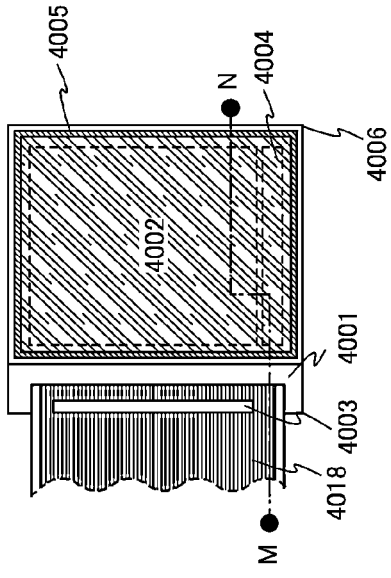
FIGS. 19A and 19B are each a top view illustrating a semiconductor device of an embodiment of the present invention and FIG. 19C is a cross-sectional view illustrating the same.
Figure 19B:
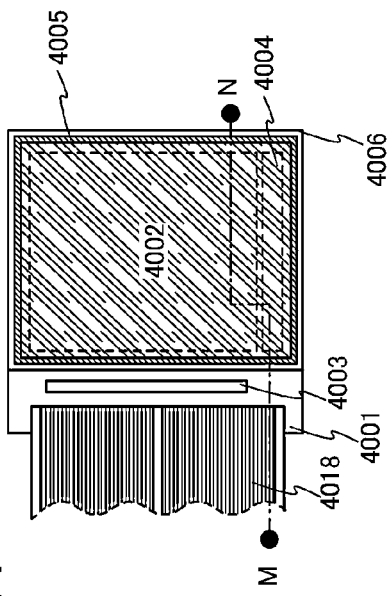
Figure 19C:
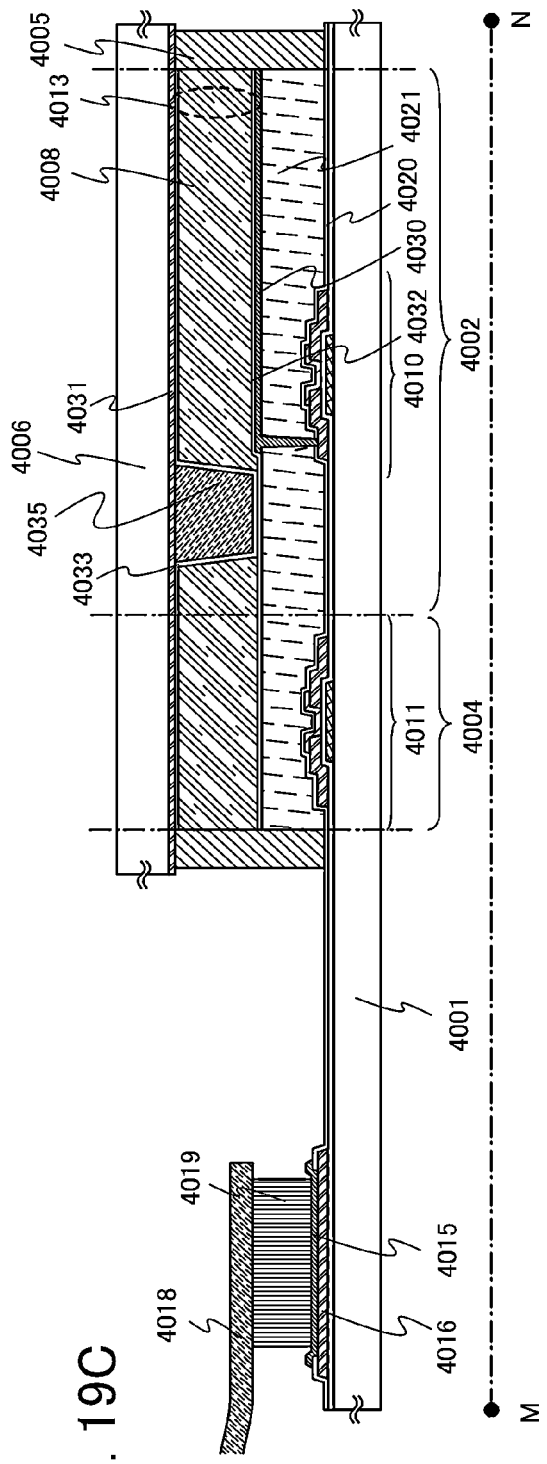

In this embodiment, the appearance and a cross section of a liquid crystal display panel, which is an embodiment of a semiconductor device of the present invention, will be described with reference to FIGS. 19A to 19C. FIGS. 19A and 19B are top views of a panel in which thin film transistors 4010 and 4011 with high electrical characteristics each including an oxide semiconductor layer over a gate insulating layer, a source electrode layer, and a drain electrode layer, and a liquid crystal element 4013 formed over a first substrate 4001 are sealed between the first substrate 4001 and a second substrate 4006 with a sealant 4005. FIG. 19C is a cross-sectional view taken along the line M-N of FIGS. 19A and 19B.

The sealant 4005 is provided so as to surround a pixel portion 4002 and a gate line driver circuit 4004 which are provided over the first substrate 4001. The second substrate 4006 is provided over the pixel portion 4002 and the gate line driver circuit 4004. Therefore, the pixel portion 4002 and the gate line driver circuit 4004 are sealed together with a liquid crystal layer 4008, by the first substrate 4001, the sealant 4005, and the second substrate 4006. A source line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 19A illustrates an example of mounting the source line driver circuit 4003 by a COG method, and FIG. 19B illustrates an example of mounting the source line driver circuit 4003 by a TAB method.

The pixel portion 4002 and the gate line driver circuit 4004 provided over the first substrate 4001 include a plurality of thin film transistors. FIG. 19C illustrates the thin film transistor 4010 included in the pixel portion 4002 and the thin film transistor 4011 included in the gate line driver circuit 4004. Over the thin film transistors 4010 and 4011, insulating layers 4020 and 4021 are provided.

Each of the thin film transistors 4010 and 4011 corresponds to a thin film transistor with high electrical characteristics including an oxide semiconductor layer over a gate insulating layer, a source electrode layer, and a drain electrode layer, and the thin film transistor 170 described in Embodiment 3 can be employed as the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be formed using glass, metal (typically, stainless steel), ceramic, or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

Reference numeral 4035 denotes a columnar spacer obtained by selective etching of an insulating film and is provided to control the distance between the pixel electrode layer 4030 and the counter electrode layer 4031 (a cell gap). Further, a spherical spacer may also be used.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at 5 wt % or more so as to improve the temperature range is used for the liquid crystal layer 4008. The liquid crystal composition which includes liquid crystal exhibiting a blue phase and a chiral agent have such characteristics that the response time is 10 μs to 100 μs, which is short, the alignment process is unnecessary because the liquid crystal composition has optical isotropy, and viewing angle dependency is small.

Although an example of a transmissive liquid crystal display device is described in this embodiment, an embodiment of the present invention can also be applied to a reflective liquid crystal display device and a transflective liquid crystal display device.

While an example of the liquid crystal display device in which the polarizing plate is provided on the outer side of the substrate (on the viewer side) and the coloring layer and the electrode layer used for a display element are provided on the inner side of the substrate in that order is described in this embodiment, the polarizing plate may be provided on the inner side of the substrate. The stacked structure of the polarizing plate and the coloring layer is not limited to this embodiment and may be set as appropriate depending on materials of the polarizing plate and the coloring layer or conditions of manufacturing steps. Further, a light-blocking film serving as a black matrix may be provided.

In this embodiment, in order to reduce surface unevenness of the thin film transistor and to improve reliability of the thin film transistor, the thin film transistor 170 obtained in Embodiment 3 is covered with the insulating layers (the insulating layer 4020 and the insulating layer 4021) functioning as a protective film or a planarizing insulating film. Note that the protective film is provided to prevent entry of contaminant impurities such as an organic substance, a metal, or moisture floating in air and is preferably a dense film. The protective film may be formed with a single layer or a stacked layer of a silicon oxide film, a silicon nitride film, a silicon oxynitride film, a silicon nitride oxide film, an aluminum oxide film, an aluminum nitride film, aluminum oxynitride film, and/or an aluminum nitride oxide film by a sputtering method. Although an example in which the protective film is formed by a sputtering method is described in this embodiment, the present invention is not limited to this example, and the protective film may be formed by a variety of methods.

In this embodiment, the insulating layer 4020 having a stacked-layer structure is formed as a protective film. Here, as a first layer of the insulating layer 4020, a silicon oxide film is formed by a sputtering method or a plasma CVD method. The use of a silicon oxide film as a protective film has an effect of preventing hillock of an aluminum film.

As a second layer of the protective film, an insulating layer is formed. In this embodiment, as the second layer of the insulating layer 4020, a silicon nitride film is formed by a plasma CVD method. The use of the silicon nitride film as the protective film can prevent mobile ions of sodium or the like from entering a semiconductor region so that variation in electrical characteristics of the TFT can be suppressed.

After the protective film is formed, the oxide semiconductor layer may be subjected to annealing (300° C. to 400° C.).

The insulating layer 4021 is formed as the planarizing insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. A siloxane-based resin may include, as a substituent, an organic group (e.g., an alkyl group, and an aryl group) or a fluoro group. The organic group may include a fluoro group. Note that the insulating layer 4021 may be formed by stacking a plurality of insulating films formed of these materials.

Note that a siloxane-based resin is a resin formed from a siloxane material as a starting material and having the bond of Si—O—Si.

A formation method of the insulating layer 4021 is not particularly limited, and the following method can be employed depending on the material: a sputtering method, an SOG method, a spin coating method, a dipping method, a spray coating method, a droplet discharge method (e.g., an ink-jet method, screen printing, offset printing, or the like), a doctor knife, a roll coater, a curtain coater, a knife coater, or the like. In the case of forming the insulating layer 4021 using a material solution, annealing (300° C. to 400° C.) of the oxide semiconductor layer may be performed at the same time as a baking step. The baking step of the insulating layer 4021 also serves as annealing of the oxide semiconductor layer, whereby a semiconductor device can be manufactured efficiently.

The pixel electrode layer 4030 and the counter electrode layer 4031 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, indium tin oxide to which silicon oxide is added, or the like.

A conductive composition including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the source line driver circuit 4003 which is formed separately, the gate line driver circuit 4004, or the pixel portion 4002 from an FPC 4018.

In this embodiment, a connection terminal electrode 4015 is formed from the same conductive film as that of the pixel electrode layer 4030 included in the liquid crystal element 4013, and a terminal electrode 4016 is formed from the same conductive film as that of the source and drain electrode layers of the thin film transistors 4010 and 4011.

The connection terminal electrode 4015 is electrically connected to a terminal included in the FPC 4018 through an anisotropic conductive film 4019.

FIGS. 19A to 19C illustrate an example in which the source line driver circuit 4003 is formed separately and mounted on the first substrate 4001; however, this embodiment is not limited to this structure. The gate line driver circuit may be separately formed and then mounted, or only part of the source line driver circuit or part of the gate line driver circuit may be separately formed and then mounted.

Figure 20:
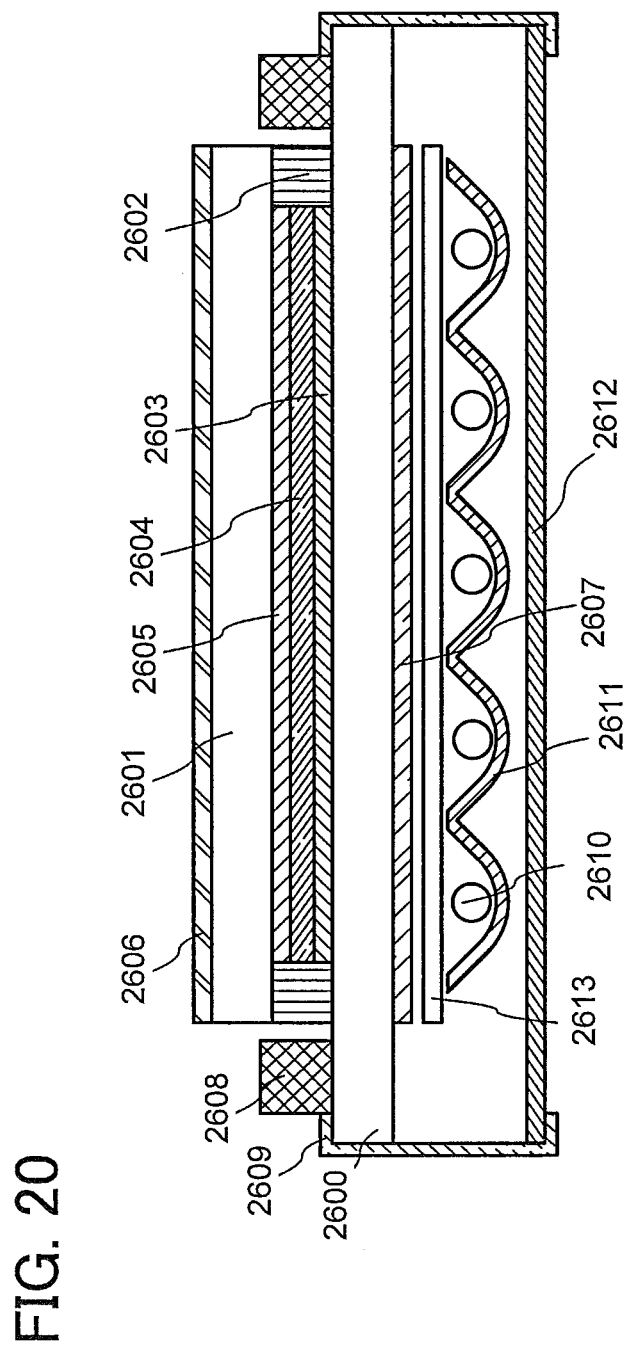
FIG. 20 is a cross-sectional view illustrating a semiconductor device of an embodiment of the present invention.

FIG. 20 illustrates an example in which a liquid crystal display module is formed as a semiconductor device with use of a TFT substrate 2600 manufactured according to an embodiment of the present invention.

FIG. 20 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Through the above steps, a highly reliable liquid crystal display device as a semiconductor device can be manufactured.

This embodiment can be combined with any of the other embodiments as appropriate.

(Embodiment 7)

In this embodiment, an example of a light-emitting display device will be described as a semiconductor device of an embodiment of the present invention. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 21:
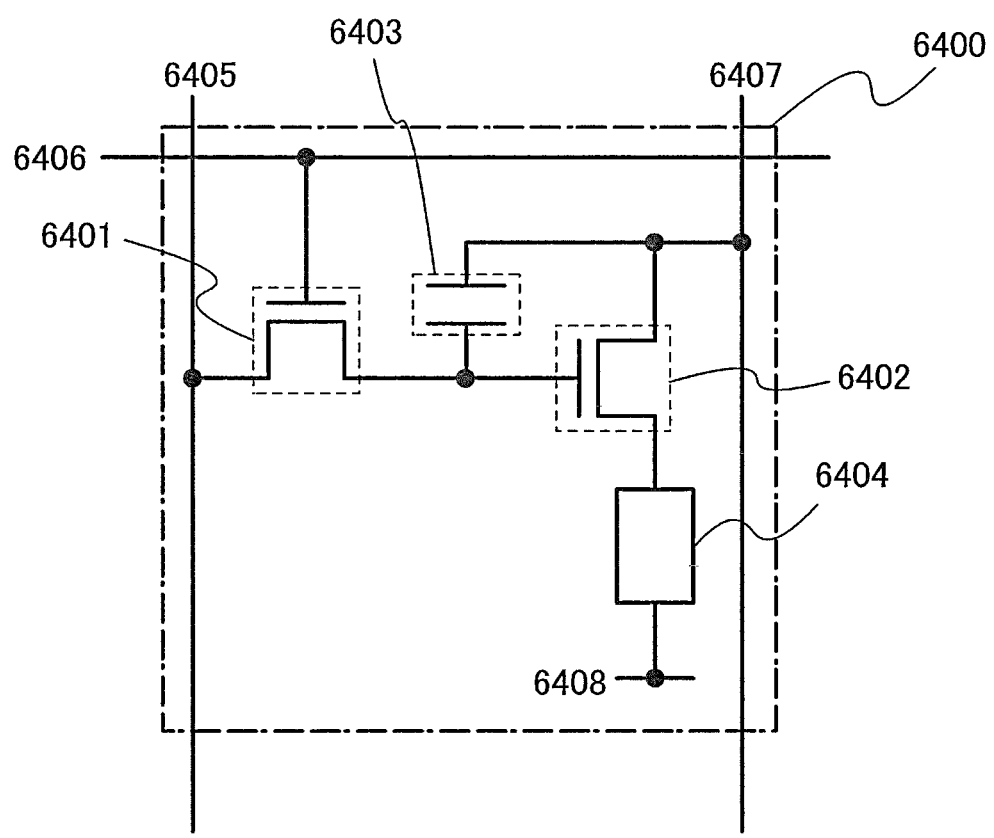
FIG. 21 is a diagram illustrating a pixel equivalent circuit of a semiconductor device of an embodiment of the present invention.

FIG. 21 illustrates an example of a pixel structure to which digital time grayscale driving can be applied, as an example of a semiconductor device to which an embodiment of the present invention is applied.

A structure and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. Note that a contact hole for directly connecting the second electrode to the gate of the driver transistor 6402 can be formed by etching of a gate insulating layer, which is described in Embodiment 2, whereby the total number of photomasks is not increased. The gate of the driver transistor 6402 is connected to a power supply line 6407 through the capacitor 6403, a first electrode of the driver transistor 6402 is connected to the power supply line 6407, and a second electrode of the driver transistor 6402 is connected to a first electrode (pixel electrode) of the light-emitting element 6404.

The second electrode (common electrode 6408) of the light-emitting element 6404 is set to a low power supply potential. Note that the low power supply potential is a potential satisfying the low power supply potential<a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher.

Note that gate capacitance of the driver transistor 6402 may be used as a substitute for the capacitor 6403, so that the capacitor 6403 can be omitted. The gate capacitance of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on and turned off. That is, the driver transistor 6402 operates in a linear region. Since the driver transistor 6402 operates in a linear region, a voltage higher than the voltage of the power supply line 6407 is applied to the gate of the driver transistor 6402. Note that a voltage higher than or equal to (voltage of the power supply line+Vth of the driver transistor 6402) is applied to the signal line 6405.

In the case of performing analog grayscale driving instead of digital time grayscale driving, the same pixel structure as that in FIG. 21 can be used by changing signal input.

In the case of performing analog grayscale driving, a voltage higher than or equal to (forward voltage of the light-emitting element 6404+Vth of the driver transistor 6402) is applied to the gate of the driver transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in a saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel structure illustrated in FIG. 21 is not limited thereto. For example, a switch, a resistor, a capacitor, a transistor, a logic circuit, or the like may be added to the pixel illustrated in FIG. 21.

Next, structures of the light-emitting element will be described with reference to FIGS. 22A to 22C. A cross-sectional structure of a pixel will be described by taking an enhancement type driving TFT as an example. Driving TFTs 7001, 7011, and 7021 used for semiconductor devices illustrated in FIGS. 22A to 22C can be manufactured in a manner similar to the thin film transistor described in Embodiment 3 and are highly reliable thin film transistors each including an oxide semiconductor layer over a gate insulating layer, a source electrode layer, and a drain electrode layer.

In order to extract light emitted from the light-emitting element, at least one of the anode and the cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. A pixel structure can be applied to a light-emitting element having any of these emission structures.

A light-emitting element having a top emission structure will be described with reference to FIG. 22A.

Figure 22A:
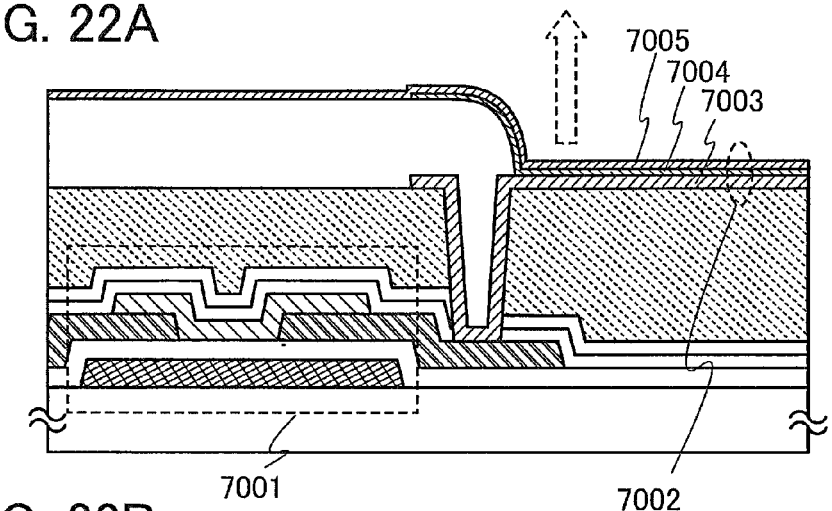
FIGS. 22A to 22C are each a view illustrating a semiconductor device of an embodiment of the present invention.

FIG. 22A is a cross-sectional view of a pixel in a case where the driving TFT 7001 is an n-channel TFT and light is emitted from a light-emitting element 7002 to an anode 7005 side. In FIG. 22A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, CaF, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film such as a film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 22A, light is emitted from the light-emitting element 7002 to the anode 7005 side as indicated by an arrow.

Next, a light-emitting element having a bottom emission structure will be described with reference to FIG. 22B. FIG. 22B is a cross-sectional view of a pixel in a case where the driving TFT 7011 is an n-channel transistor and light is emitted from a light-emitting element 7012 to a cathode 7013 side. In FIG. 22B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, a variety of materials can be used as in the case of FIG. 22A as long as they are conductive materials having a low work function. The cathode 7013 is formed to have a thickness that can transmit light (preferably, approximately 5 nm to 30 nm). For example, an aluminum film with a thickness of 20 nm can be used as the cathode 7013. Similar to the case of FIG. 19A, the light-emitting layer 7014 may be formed using either a single layer or a plurality of layers stacked. The anode 7015 is not required to transmit light, but can be formed using a light-transmitting conductive material as in the case of FIG. 22A. As the light-blocking film 7016, a metal or the like that reflects light can be used for example; however, it is not limited to a metal film. For example, a resin or the like to which black pigments are added can also be used.

The light-emitting element 7012 corresponds to a region where the light-emitting layer 7014 is sandwiched between the cathode 7013 and the anode 7015. In the case of the pixel illustrated in FIG. 22B, light is emitted from the light-emitting element 7012 to the cathode 7013 side as indicated by an arrow.

Next, a light-emitting element having a dual emission structure will be described with reference to FIG. 22C. In FIG. 22C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 22A, the cathode 7023 can be formed using a variety of conductive materials as long as they have a low work function. The cathode 7023 is formed to have a thickness that can transmit light. For example, a film of Al having a thickness of 20 nm can be used as the cathode 7023. As in FIG. 22A, the light-emitting layer 7024 may be formed using either a single layer or a plurality of layers stacked. The anode 7025 can be formed using a light-transmitting conductive material as in the case of FIG. 22A.

The light-emitting element 7022 corresponds to a region where the cathode 7023, the light-emitting layer 7024, and the anode 7025 overlap with one another. In the case of the pixel illustrated in FIG. 22C, light is emitted from the light-emitting element 7022 to both the anode 7025 side and the cathode 7023 side as indicated by arrows.

Note that, although an organic EL element is described here as a light-emitting element, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 22B:
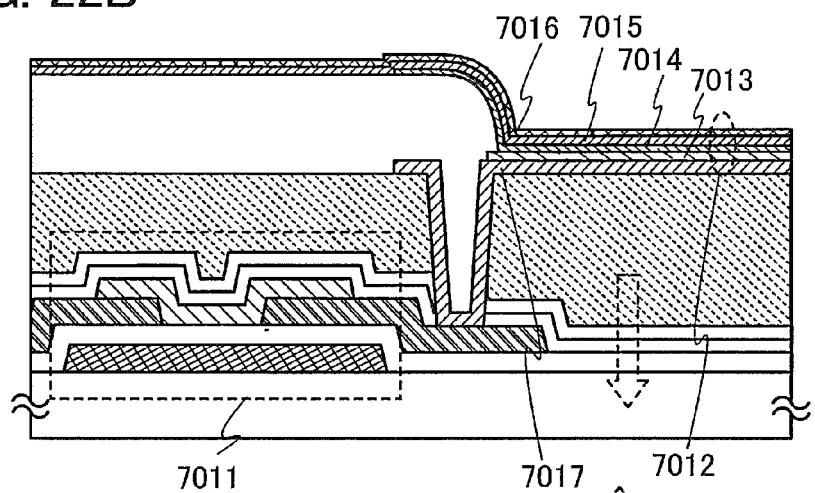
Figure 22C:
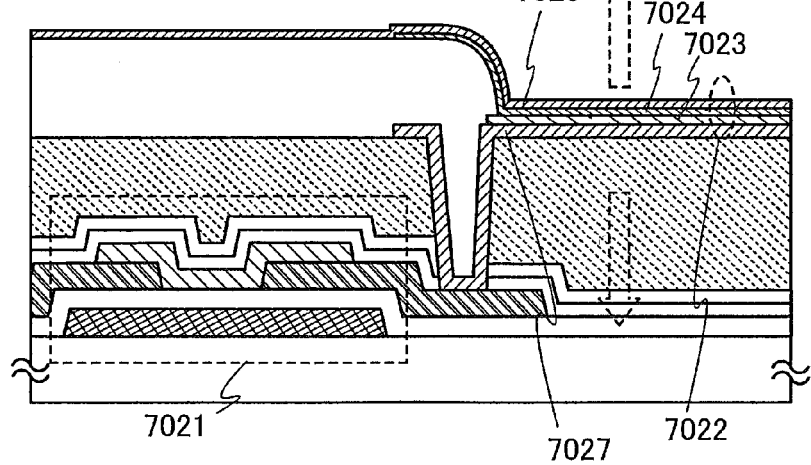

A semiconductor device described in this embodiment is not limited to the structures illustrated in FIGS. 22A to 22C and can be modified in various ways based on the spirit of techniques according to the present invention.

Figure 23A:
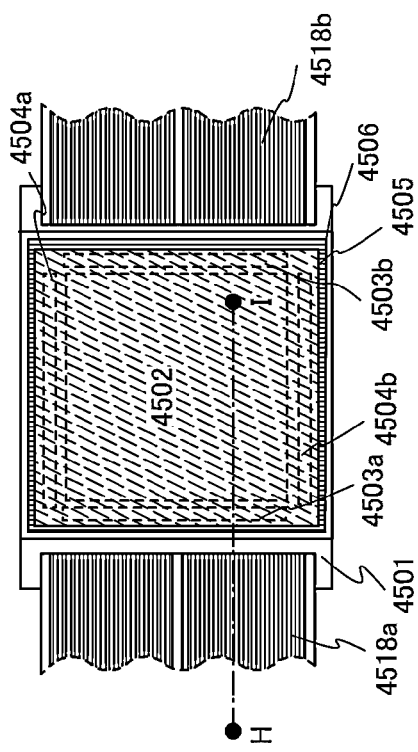
FIG. 23A is a top view illustrating a semiconductor device of an embodiment of the present invention and FIG. 23B is a cross-sectional view illustrating the same.
Figure 23B:
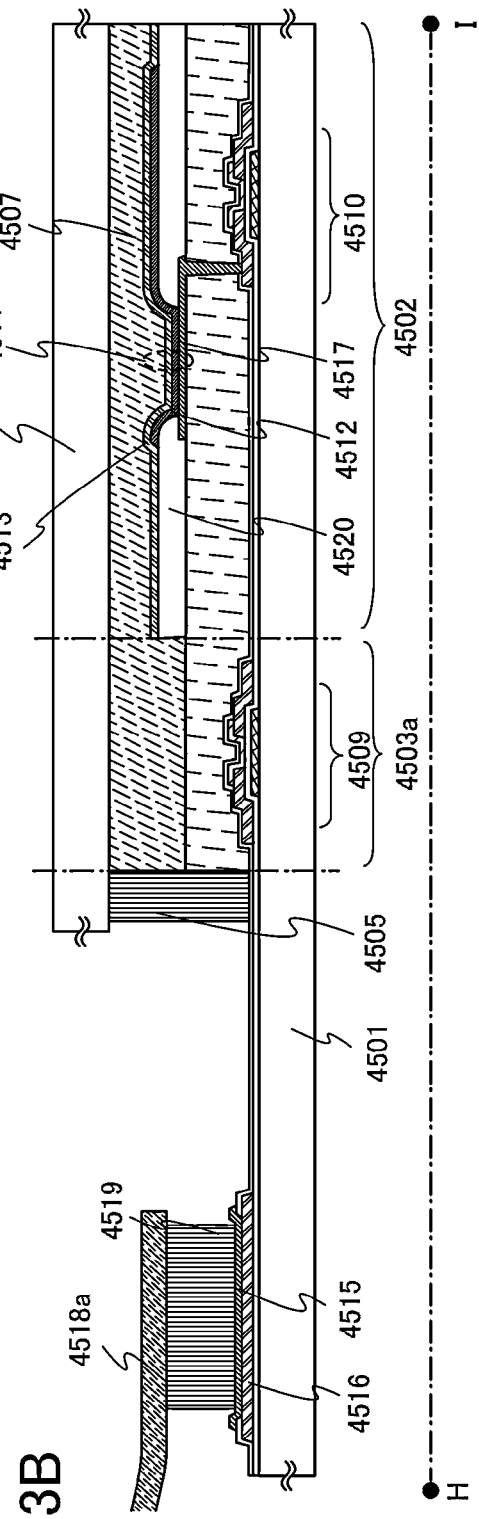

Next, the appearance and a cross section of a light-emitting display panel (also referred to as a light-emitting panel), which is one embodiment of a semiconductor device of the present invention, will be described with reference to FIGS. 23A and 23B. FIG. 23A is a top view of a panel in which a thin film transistor with high electrical characteristics including a gate insulating layer over a first substrate, a source and drain electrode layers over the gate insulating layer, and an oxide semiconductor layer over the source and drain electrode layers and a light-emitting element are sealed between the first substrate and a second substrate with a sealant. FIG. 23B is a cross-sectional view taken along the line H-I of FIG. 22A.

A sealant 4505 is provided so as to surround a pixel portion 4502, source line driver circuits 4503a and 4503b, and gate line driver circuits 4504a and 4504b which are provided over a first substrate 4501. In addition, a second substrate 4506 is provided over the pixel portion 4502, the source line driver circuits 4503a and 4503b, and the gate line driver circuits 4504a and 4504b. Accordingly, the pixel portion 4502, the source line driver circuits 4503a and 4503b, and the gate line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air as described above.

The pixel portion 4502, the source line driver circuits 4503a and 4503b, and the gate line driver circuits 4504a and 4504b formed over the first substrate 4501 each include a plurality of thin film transistors, and a thin film transistor 4510 included in the pixel portion 4502 and a thin film transistor 4509 included in the source line driver circuit 4503a are illustrated as an example in FIG. 23B.

Each of the thin film transistors 4509 and 4510 corresponds to a highly reliable thin film transistor including an oxygen-excess oxide semiconductor layer over a gate insulating layer, a source electrode layer, a drain electrode layer, a source region, and a drain region which have been subjected to oxygen radical treatment, and including oxygen-deficient oxide semiconductor layers as the source region and the drain region, and the thin film transistor described in Embodiments 3 can be employed as the thin film transistors 4509 and 4510. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that a structure of the light-emitting element 4511 is a stacked-layer structure of the first electrode layer 4517, the electroluminescent layer 4512, and the second electrode layer 4513, but the present invention is not limited to that described in this embodiment. The structure of the light-emitting element 4511 can be changed as appropriate depending on the direction in which light is extracted from the light-emitting element 4511, or the like.

A partition wall 4520 is formed using an organic resin film, an inorganic insulating film, or organic polysiloxane. It is particularly preferable that the partition wall 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition wall 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the source line driver circuits 4503a and 4503b, the gate line driver circuits 4504a and 4504b, or the pixel portion 4502 from FPCs 4518a and 4518b.

In Embodiment 7, a connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal included in the FPC 4518a through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In Embodiment 7, nitrogen is used for the filler 4507.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The source line driver circuits 4503a and 4503b and the gate line driver circuits 4504a and 4504b may be provided as driver circuits formed using a single crystal semiconductor film or polycrystalline semiconductor film over a substrate separately prepared. In addition, only the source line driver circuits or part thereof, or the gate line driver circuits or part thereof may be separately formed and mounted. This embodiment is not limited to the structure illustrated in FIGS. 23A and 23B.

Through the above steps, a highly reliable light-emitting display device (display panel) as a semiconductor device can be manufactured.

Embodiment 7 can be combined with any of the other embodiments as appropriate.

(Embodiment 8)

A semiconductor device of an embodiment of the present invention can be applied to an electronic paper. An electronic paper can be used for electronic devices of a variety of fields as long as they can display data. For example, an electronic paper can be applied to an electronic book (e-book) reader, a poster, an advertisement in a vehicle such as a train, displays of various cards such as a credit card, and the like. Examples of the electronic devices are illustrated in FIGS. 24A and 24B and FIG. 25.

Figure 24A:
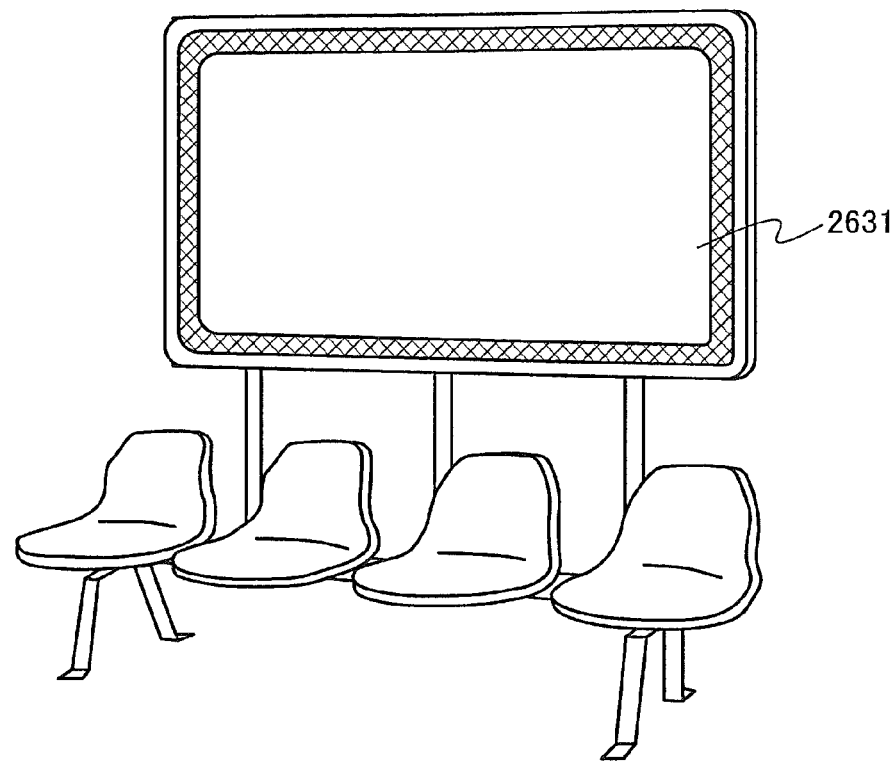
FIGS. 24A and 24B are views illustrating examples of usage patterns of an electronic paper.

FIG. 24A illustrates a poster 2631 formed using an electronic paper. In a case where an advertising medium is printed paper, the advertisement is replaced by manpower; however, by use of an electronic paper to which the present invention is applied, the advertising display can be changed in a short time. Further, an image can be stably displayed without being distorted. Note that the poster may be configured to transmit and receive data wirelessly.

Figure 24B:
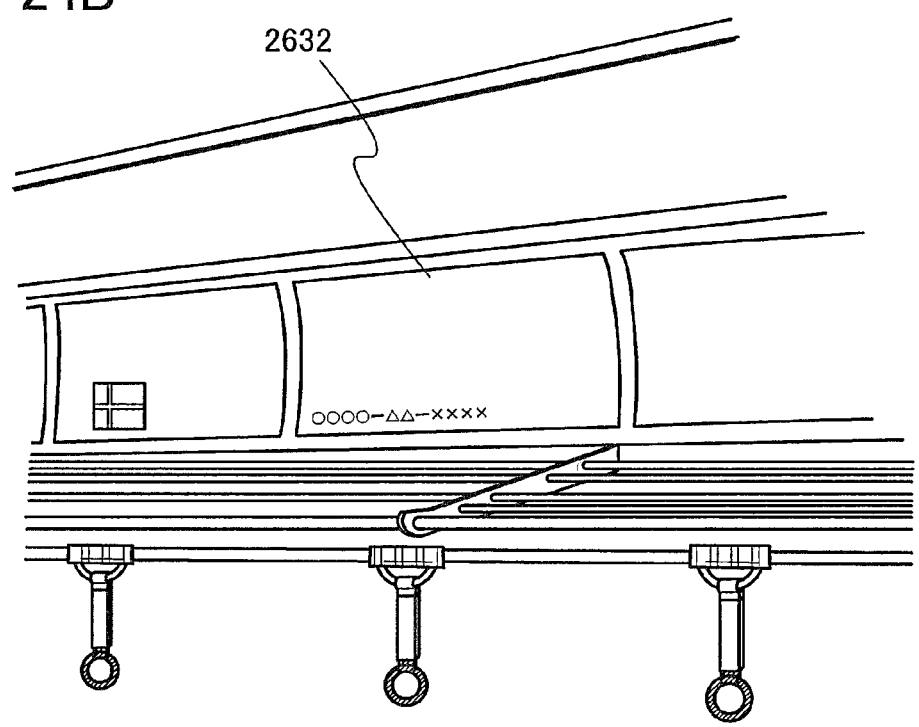

FIG. 24B illustrates an advertisement 2632 in a vehicle such as a train. In a case where an advertising medium is printed paper, the advertisement is replaced by manpower; however, by use of an electronic paper to which an embodiment of the present invention is applied, the advertising display can be changed in a short time without a lot of manpower. Further, an image can be stably displayed without being distorted. Note that the advertisement in a vehicle may be configured to transmit and receive data wirelessly.

Figure 25:
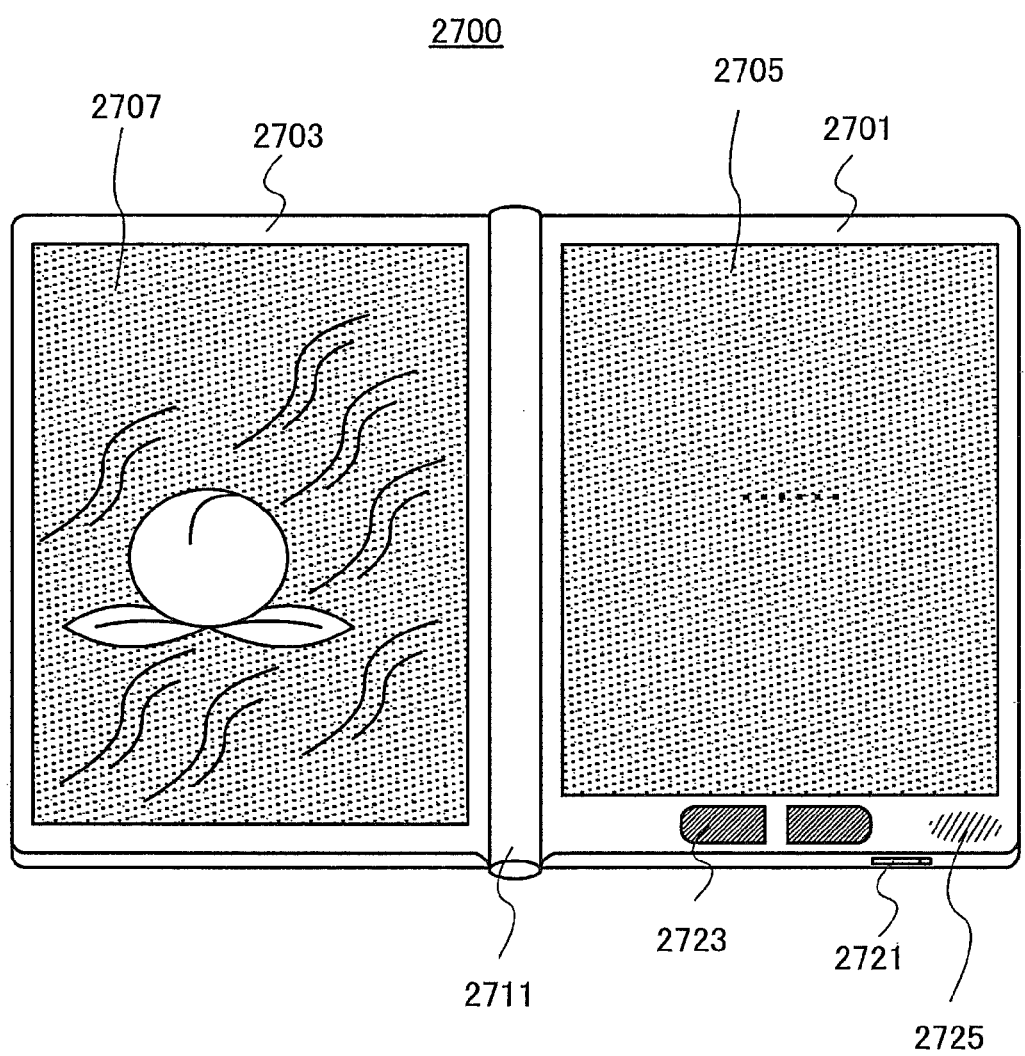
FIG. 25 is an external view illustrating an example of an e-book reader.

FIG. 25 illustrates an example of an electronic book reader 2700. For example, the electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can be operated like a paper book.

A display portion 2705 and a display portion 2707 are incorporated in the housing 2701 and the housing 2703, respectively. The display portion 2705 and the display portion 2707 may be configured to display one image or different images. In a case where the display portion 2705 and the display portion 2707 display different images, for example, a display portion on the right side (the display portion 2705 in FIG. 25) can display text and a display portion on the left side (the display portion 2707 in FIG. 25) can display graphics.

FIG. 25 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may be provided on the surface of the housing, on which the display portion is provided. Further, an external connection terminal (an earphone terminal, a USB terminal, a terminal that can be connected to various cables such as an AC adapter and a USB cable, or the like), a recording medium insert portion, or the like may be provided on the back surface or the side surface of the housing. Further, the electronic book reader 2700 may have a function of an electronic dictionary.

The electronic book reader 2700 may be configured to transmit and receive data wirelessly. The structure can be employed in which desired book data or the like is purchased and downloaded from an electronic book server wirelessly.

Embodiment 8 can be combined with any of the other embodiments as appropriate.

(Embodiment 9)

A semiconductor device according to an embodiment of the present invention can be applied to a variety of electronic devices (including an amusement machine). Examples of electronic devices include a television set (also referred to as a "television" or a "television receiver"), a monitor of a computer or the like, a camera such as a digital camera or a digital video camera, a digital photo frame, a mobile phone handset (also referred to as a "mobile phone" or a "mobile phone device"), a portable game console, a portable information terminal, an audio reproducing device, a large-sized game machine such as a pachinko machine, and the like.

Figure 26A:
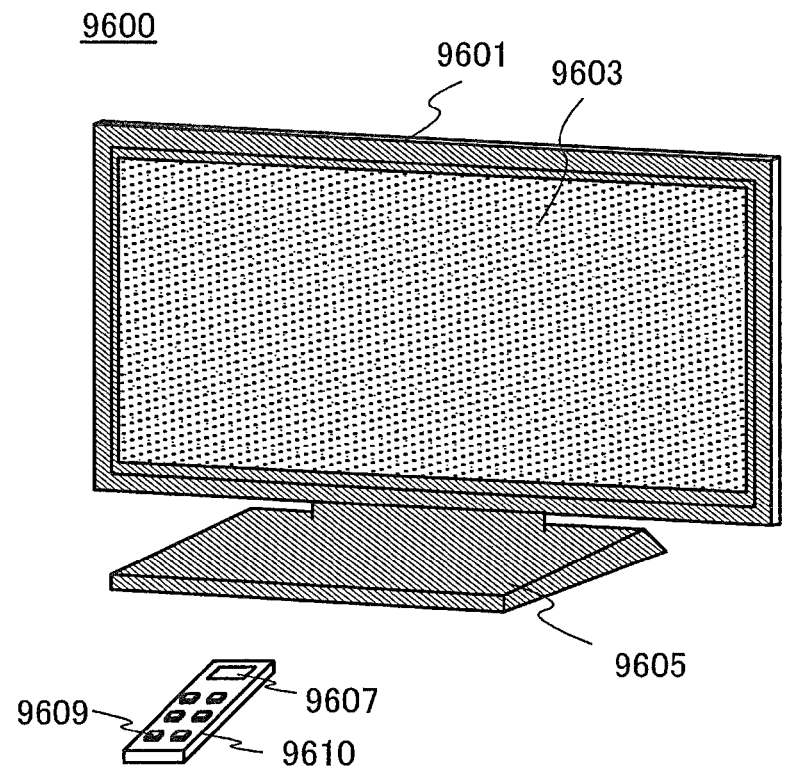
FIGS. 26A and 26B are external views illustrating a television set and a digital photo frame, respectively.

FIG. 26A illustrates an example of a television set 9600. In the television set 9600, a display portion 9603 is incorporated in a housing 9601. The display portion 9603 can display an image. Further, the housing 9601 is supported by a stand 9605 here.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Further, the remote controller 9610 may be provided with a display portion 9607 for displaying data outputted from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

Figure 26B:
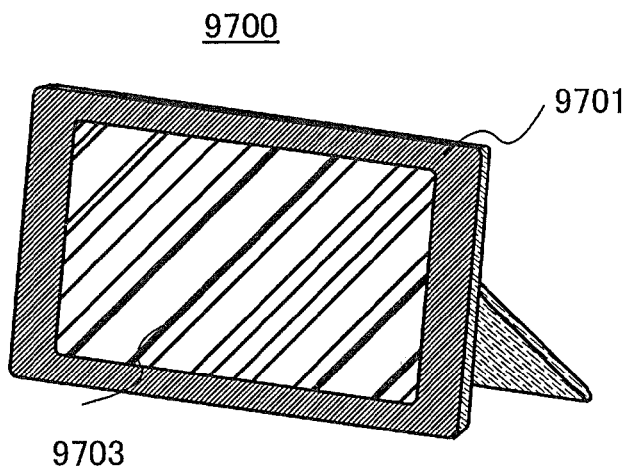

FIG. 26B illustrates an example of a digital photo frame 9700. For example, in the digital photo frame 9700, a display portion 9703 is incorporated in a housing 9701. The display portion 9703 can display various images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 27A:
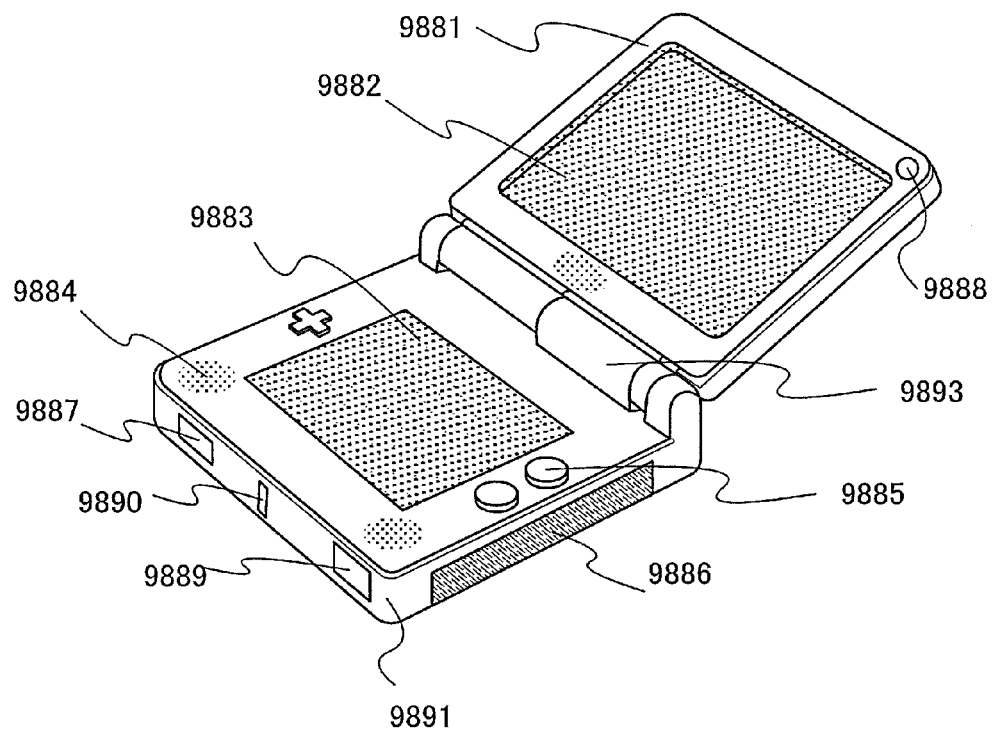
FIGS. 27A and 27B are external views illustrating examples of game machines.

FIG. 27A is a portable game machine and includes two housings, a housing 9881 and a housing 9891, which are connected with a joint portion 9893 so that the portable game machine can be opened or folded. A display portion 9882 is incorporated in the housing 9881, and a display portion 9883 is incorporated in the housing 9891. In addition, the portable game machine illustrated in FIG. 27A is provided with a speaker portion 9884, a recording medium insert portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. Needless to say, the structure of the portable game machine is not limited to that described above. The portable game machine may have a structure in which additional accessory equipment is provided as appropriate as long as at least a semiconductor device according to an embodiment of the present invention is provided. The portable game machine illustrated in FIG. 27A has a function of reading a program or data stored in a recording medium to display it on the display portion, and a function of sharing information with another portable game machine by wireless communication. Note that a function of the portable game machine illustrated in FIG. 27A is not limited to those described above, and the portable game machine can have a variety of functions.

Figure 27B:
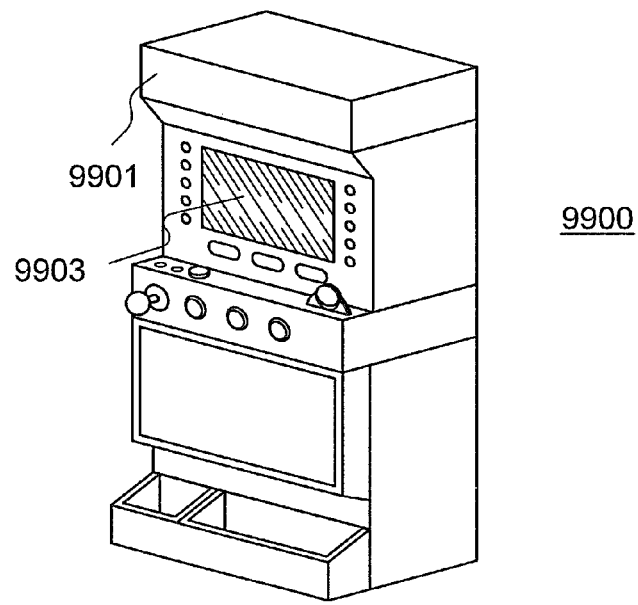

FIG. 27B illustrates an example of a slot machine 9900 which is a large-sized amusement machine. In the slot machine 9900, a display portion 9903 is incorporated in a housing 9901. In addition, the slot machine 9900 is provided with operation means such as a start lever and a stop switch, a coin slot, a speaker, or the like. Needless to say, the structure of the slot machine 9900 is not limited to the above-described structure. The slot machine may have a structure in which additional accessory equipment is provided as appropriate as long as at least a semiconductor device according to the present invention is provided.

Figure 28A:
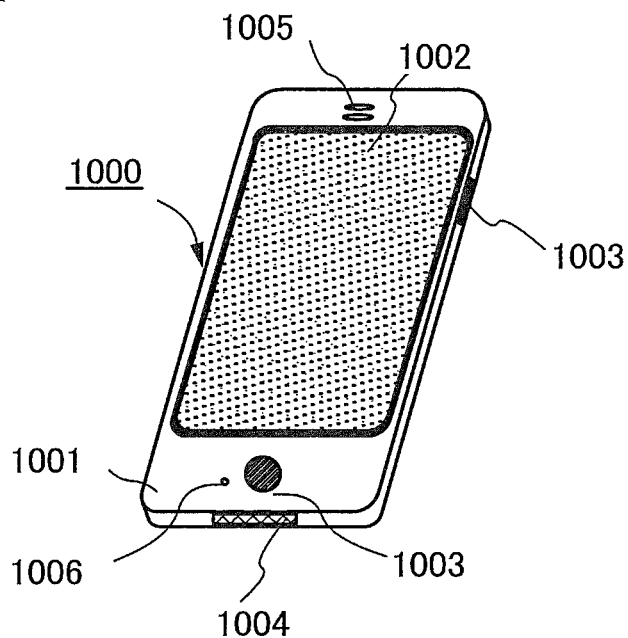
FIGS. 28A and 28B are external views illustrating examples of mobile phones.

FIG. 28A illustrates an example of a mobile phone handset 1000. The mobile phone handset 1000 is provided with a display portion 1002 incorporated in a housing 1001, operation buttons 1003, an external connection port 1004, a speaker 1005, a microphone 1006, and the like.

When the display portion 1002 of the mobile phone handset 1000 illustrated in FIG. 28A is touched with a finger or the like, data can be input into the mobile phone handset 1000. Further, operations such as making calls and texting can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode which is a combination of the two modes, that is, a combination of the display mode and the input mode.

For example, in the case of making a call or texting, a text input mode mainly for inputting text is selected for the display portion 1002 so that characters displayed on a screen can be inputted. In that case, it is preferable to display a keyboard or number buttons on almost all area of the screen of the display portion 1002.

When a detection device including a sensor for detecting inclination, such as a gyroscope or an acceleration sensor, is provided inside the mobile phone handset 1000, display on the screen of the display portion 1002 can be automatically changed by determining the orientation of the mobile phone handset 1000 (whether the mobile phone handset 1000 is placed horizontally or vertically for a landscape mode or a portrait mode).

The screen modes are changed by touching the display portion 1002 or using the operation buttons 1003 of the housing 1001. Alternatively, the screen modes may be changed depending on the kind of the image displayed on the display portion 1002. For example, when a signal of an image displayed on the display portion is the one of moving image data, the screen mode is changed to the display mode. When the signal is the one of text data, the screen mode is changed to the input mode.

Further, in the input mode, when input by touching the display portion 1002 is not performed for a certain period while a signal detected by the optical sensor in the display portion 1002 is detected, the screen mode may be controlled so as to be changed from the input mode to the display mode.

The display portion 1002 may function as an image sensor. For example, an image of a palm print, a fingerprint, or the like is taken when the display portion 1002 is touched with a palm or a finger, whereby personal identification can be performed. Further, when a backlight or a sensing light source which emits a near-infrared light in the display portion is used, an image of a finger vein, a palm vein, or the like can be taken.

Figure 28B:
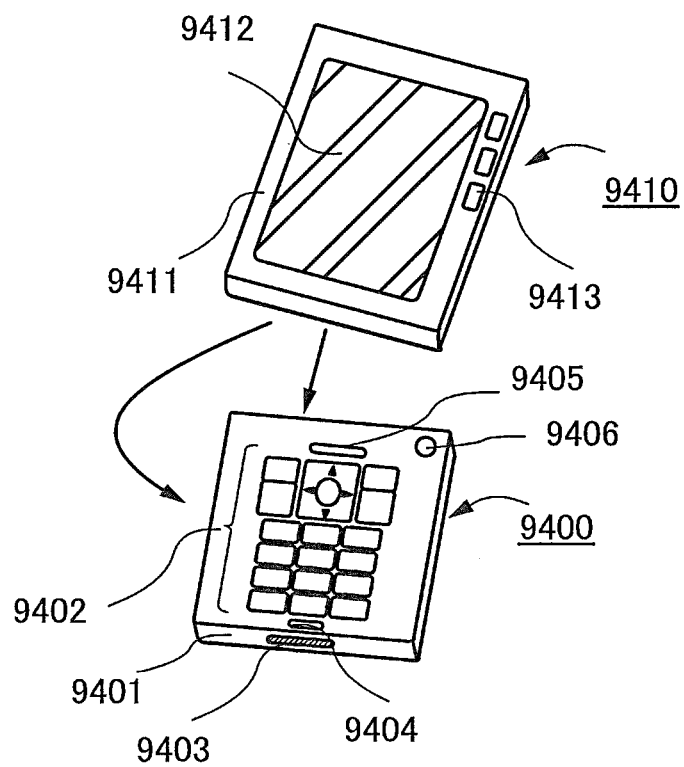

FIG. 28B also illustrates an example of a mobile phone. The mobile phone illustrated in FIG. 28B has a display device 9410 having a display portion 9412 and operation buttons 9413 in a housing 9411 and a communication device 9400 having operation buttons 9402, an external input terminal 9403, a microphone 9404, a speaker 9405, and a light-emitting portion 9406 which emits light when receiving a call in a housing 9401. The display device 9410 having a display function can be detached from or attached to the communication device 9400 having a telephone function in two directions indicated by the arrows. Accordingly, the display device 9410 and the communication device 9400 can be attached to each other along their short sides or long sides. In addition, in a case where only the display function is needed, the display device 9410 is detached from the communication device 9400 so that the display device 9410 can be used by itself. The communication device 9400 and the display device 9410 are capable of sending and receiving images or input information by a wireless communication or wire communication. The communication device 9400 and the display device 9410 each have a rechargeable battery.

Embodiment 9 can be combined with any of the other embodiments as appropriate.

(Embodiment 10)

In Embodiment 10, an example in which a 4-inch QVGA liquid crystal display panel is actually manufactured will be described.

A bottom-gate bottom-contact TFT that can be obtained through the process described in Embodiment 3 is advantageous for an increase in productivity and high-speed driving of a source line driver circuit, in which case a source electrode wiring and a drain electrode wiring over a gate insulating film can be patterned so as to have a size designed by photolithography and dry etching, which enables control of a channel length and miniaturization. In addition, as illustrated in FIG. 5C, a storage capacitor $C_s$ which is placed in a pixel of a liquid crystal display device can be formed of a capacitor wiring, a gate insulating layer, a protective film, and a pixel electrode without using an oxide semiconductor layer (an In—Ga—Zn—O non-single-crystal film), and therefore large capacitance can be secured in a small area. In the case of a 4-inch panel having a display standard of QVGA, opening aperture can be increased by 4%. Moreover, using a structure in which the source or drain electrode is directly connected to the gate electrode through a contact hole formed in the gate insulating film (such a structure is also referred to as a "direct contact structure") makes it possible to reduce the number of contacts in a shift register. The reduction in the number of contacts enables an increase in yield.

Figure 29:
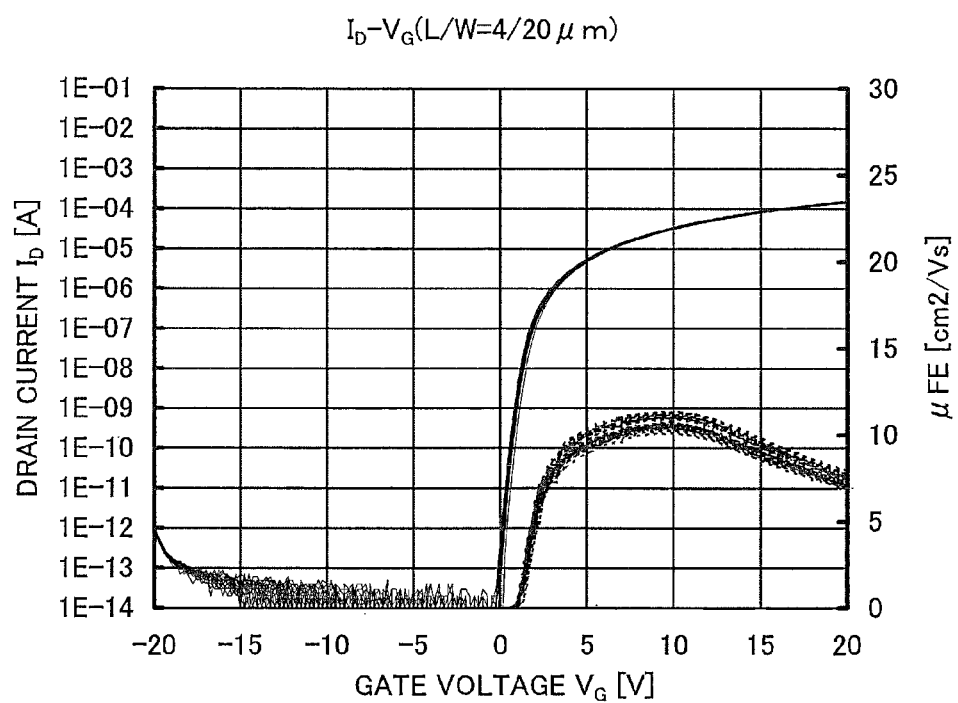
FIG. 29 is a graph showing $V_G$-$I_D$ curve that is TFT electrical characteristics.

FIG. 29 shows measurement results of TFTs (32 randomly selected TFTs over the same substrate) that are actually manufactured in accordance with the process described in Embodiment 3. Conditions of each of the TFTs are as follows: the thickness of a gate oxide film (relative dielectric constant: 4.1) was 200 nm, the channel length L was 4 μm, the channel width W was 20 μm, and each of the 32 TFTs over the same substrate was measured. In FIG. 29, $V_G$-$I_D$ curves of the 32 TFTs over the same substrate almost overlap, which shows that TFTs that exhibit little variation can be obtained. Field effect mobility μFE was calculated from the VG-ID curves in FIG. 29. The field effect mobility is calculated on the assumption of gradual channel approximation, and in a saturation region (Vds=10 V), the value of the TFT out of 32 TFTs which shows the maximum field effect mobility (μFE) is 11.3 cm$^2$/Vs.

Figure 30:
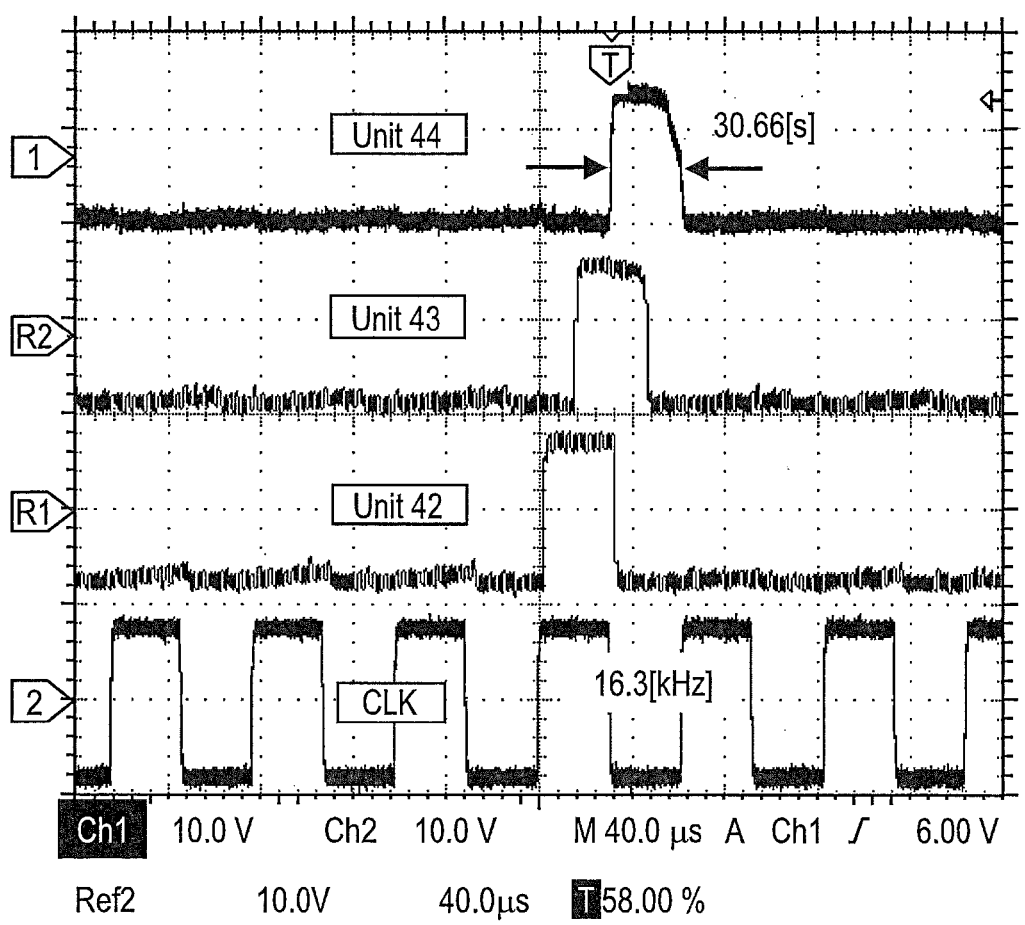
FIG. 30 is a graph showing results of measurement with an oscilloscope, which shows output waveforms of Units 42 to 44 of a shift register.

A shift register consisting of a plurality of units illustrated in FIG. 17 and FIG. 18 is used for a driver circuit. The driver circuit is designed so as to be driven at a voltage of 16 V and needs two positive power supplies and one negative power supply. The channel length L and the channel width W of a TFT of the driver circuit are 10 μm and 50 μm, respectively. The number of stages of the shift registers in the driver circuit was 44. FIG. 30 shows results of measurement of the actually manufactured driver circuit with an oscilloscope. In FIG. 30, the top waveform is an output waveform of the last stage (Unit 44) of the shift register, the waveform under Unit 44 is an output waveform of is Unit 43, and the waveform under Unit 43 is an output waveform of Unit 42. The driving voltage is 16 V. Consumption current at this time is 0.57 mA. The bottom waveform in FIG. 30 is one of the waveforms in the four-phase clock, and part of the waveform is outputted from Unit 42 of the shift register. In a case where the shift register is used for a gate line driver circuit, the following are required: a driver driving frequency of 3.66 kHz and a gate selection period of less than or equal to 68.31 μs in the case of a panel of the display standard of QVGA, and a gate selection period of less than or equal to 34.44 μs in the case of a panel of the display standard of VGA. It is found that the driver circuit of Embodiment 10 satisfies the above specifications.

Figure 31:
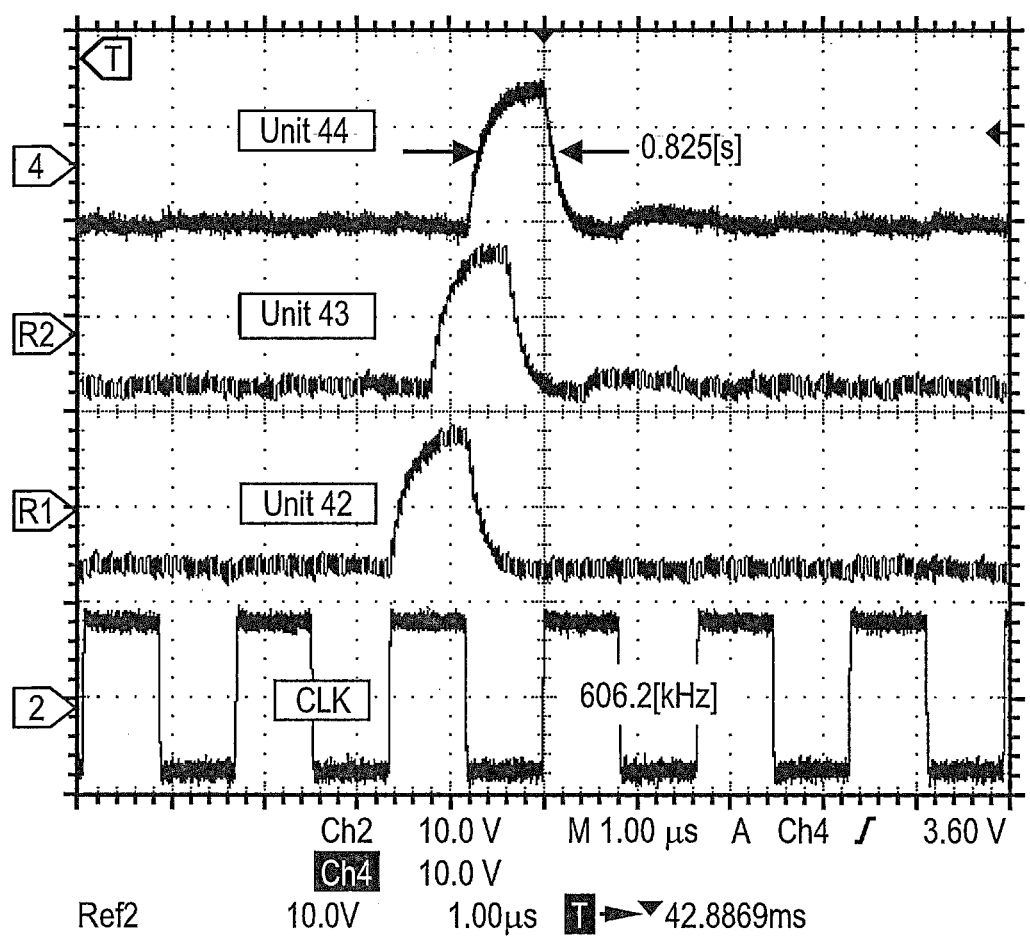
FIG. 31 is a graph showing results of measurement with an oscilloscope, which shows output waveforms at the time of the maximum driving frequency.

Next, FIG. 31 shows driver output waveforms at the maximum driving frequency (606.2 kHz). The fourth stage waveform is one of the waveforms in the four-phase clock, and part of the waveform is outputted from Unit 42 of the driver circuit. In the case of a panel of the display standard of QVGA, the driver driving frequency is 234.24 kHz, and when a video signal is written with the driver output waveform using this driver circuit, the writing period is 1.07 μs. According to this result, an increase in the number of video signals and transmission of video data to a panel by division input enable a pixel portion, a gate line driver circuit, and a source line driver circuit to be mounted on the same substrate. In Embodiment 10, the number of video signals is 16.

A driver circuit including the above shift registers and a pixel portion were formed over the same substrate to manufacture a 4-inch full-color liquid crystal display. The specifications of the display are shown in Table 3.

TABLE 3

| Items | Specification |
| --- | --- |
| Diagonal size | 4.015 inches |
| No. of pixels | 320 × RGB × 240 (QVGA) |
| Resolution | 99.6 dpi |
| Panel size | 8.74 cm × 9.94 cm |
| Driver | Integration |
| Aperture ratio | 41.8% |

The number of pixels of the manufactured display is 320×RGB×240 (QVGA). The pixel density thereof is 99.6 dpi. The manufactured display is a display incorporating the source line driver circuit and the gate line driver circuit.

Figure 32:
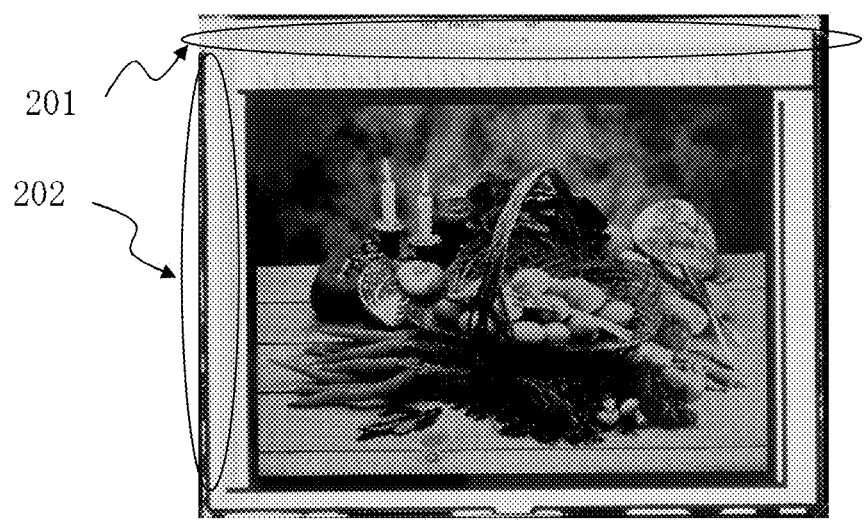
FIG. 32 is a view showing how a liquid crystal display displays an image.

The clock frequency of the gate line driver circuit was 3.66 kHz and the gate selection period thereof was 68.31 μs. Sixteen video signals are analog-inputted at the same time and written to the panel through a switch. The video writing period was 1.07 [μs] and the driving frequency of the source line driver circuit was 234.24 kHz. A 4.015-inch full-color active matrix liquid crystal display was manufactured experimentally. FIG. 32 illustrates the display. Since a display portion and the driver circuits are formed over the same substrate, a source line driver circuit 201 and a gate line driver circuit 202 are included in the periphery of a display region as illustrated in FIG. 32.

This application is based on Japanese Patent Application serial no. 2008-259064 filed with Japan Patent Office on Oct. 3, 2008 and Japanese Patent Application serial no. 2009-150998 filed with Japan Patent Office on Jun. 25, 2009, the entire contents of which are hereby incorporated by reference.

What is claimed is:

1. A display device comprising:
    a pixel portion comprising a first thin film transistor including a first oxide semiconductor layer; and
    a driver circuit comprising:
        a second thin film transistor including:
            a first gate electrode;
            a gate insulating layer over the first gate electrode; and
            a second oxide semiconductor layer over the gate insulating layer;
        a third thin film transistor including:
            a second gate electrode;
            the gate insulating layer over the second gate electrode; and
            a third oxide semiconductor layer over the gate insulating layer;
        a first wiring; and
        a second wiring overlapping with both the first gate electrode and the second gate electrode with the gate insulating layer interposed therebetween,
    wherein the second wiring is in direct contact with the second oxide semiconductor layer and the third oxide semiconductor layer,
    wherein an entire area of the third oxide semiconductor layer overlaps the second gate electrode,
    wherein the second gate electrode includes a first region, a second region and a third region,
    wherein the second region is between the first region and the third region in a channel length direction of the third thin film transistor,
    wherein a channel formation region in the third oxide semiconductor layer overlaps the first region of the second gate electrode,
    wherein a direct contact area of the first wiring and the third oxide semiconductor layer overlaps the second region of the second gate electrode, and
    wherein the first wiring is in direct contact with the third region of the second gate electrode through a contact hole of the gate insulating layer.

2. The display device according to claim 1, wherein the first oxide semiconductor layer, the second oxide semiconductor layer, and the third oxide semiconductor layer contain indium, gallium, and zinc.

3. The display device according to claim 1, wherein the pixel portion and the driver circuit are provided over the same substrate.

4. The display device according to claim 1,
    wherein the driver circuit further comprises an insulating layer over the second oxide semiconductor layer and the third oxide semiconductor layer, and
    wherein the insulating layer is a stacked-layer of a silicon oxide film and a silicon nitride film.

5. The display device according to claim 1,
    wherein the gate insulating layer is a stacked-layer of a silicon nitride film and a silicon oxide film.

6. An electric device comprising the display device according to claim 2.

7. A display device comprising:
    a pixel portion over a substrate, the pixel portion comprising:
        a first thin film transistor including a first gate electrode and a first oxide semiconductor layer over the first gate electrode with a gate insulating layer between the first gate electrode and the first oxide semiconductor layer; and
    a driver circuit over the substrate, the driver circuit comprising:
        a wiring over the gate insulating layer;
        a second thin film transistor including:
            a second gate electrode; and
            a second oxide semiconductor layer over the second gate electrode with the gate insulating layer between the second gate electrode and the second oxide semiconductor layer, wherein the second oxide semiconductor layer overlaps the wiring; and
        a third thin film transistor including:
            a third gate electrode; and
            a third oxide semiconductor layer over the third gate electrode with the gate insulating layer between the third gate electrode and the third oxide semiconductor layer, wherein the third oxide semiconductor layer overlaps the wiring,
    wherein the wiring is in direct contact with the second oxide semiconductor layer, the third oxide semiconductor layer, and the third gate electrode,
    wherein an entire area of the third oxide semiconductor layer overlaps the third gate electrode,
    wherein the third gate electrode includes a first region, a second region and a third region,
    wherein the second region is between the first region and the third region in a channel length direction of the third thin film transistor,
    wherein a channel formation region in the third oxide semiconductor layer overlaps the first region of the third gate electrode,
    wherein a direct contact area of the wiring and the third oxide semiconductor layer overlaps the second region of the third gate electrode, and
    wherein the wiring is in direct contact with the third region of the third gate electrode through a contact hole of the gate insulating layer.

8. The display device according to claim 7, wherein the first oxide semiconductor layer, the second oxide semiconductor layer, and the third oxide semiconductor layer contain indium, gallium, and zinc.

9. The display device according to claim 7,
    wherein the driver circuit further comprises an insulating layer over the second oxide semiconductor layer and the third oxide semiconductor layer, and
    wherein the insulating layer is a stacked-layer of a silicon oxide film and a silicon nitride film.

10. The display device according to claim 7,
wherein the gate insulating layer is a stacked-layer of a silicon nitride film and a silicon oxide film.

11. An electric device comprising the display device according to claim 7.

\* \* \* \* \*